(12) United States Patent
Makino

(10) Patent No.: US 6,733,871 B2
(45) Date of Patent: May 11, 2004

(54) PROCESS FOR PRODUCING CERAMIC MEMBER FOR BONDING, CERAMIC MEMBER FOR BONDING, VACUUM SWITCH, AND VACUUM VESSEL

(75) Inventor: Yusuke Makino, Kasugai (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/265,144

(22) Filed: Oct. 7, 2002

(65) Prior Publication Data

US 2003/0148138 A1 Aug. 7, 2003

(30) Foreign Application Priority Data

Oct. 5, 2001 (JP) .................................. P. 2001-310026

(51) Int. Cl.$^7$ ............................. B32B 3/00; C03B 29/00
(52) U.S. Cl. .................... 428/210; 428/209; 428/469; 428/701; 428/702; 428/698; 428/432; 428/621; 428/655; 156/89.11; 156/89.12; 156/89.14; 156/89.19; 156/89.21
(58) Field of Search ................... 428/210, 209, 428/469, 701, 702, 698, 432, 621, 655; 156/89.11, 89.12, 89.14, 89.19, 89.21

(56) References Cited

U.S. PATENT DOCUMENTS 3,284,174 A   11/1966   Zimmer et al.
4,381,198 A   4/1983    Kondo et al.
6,506,481 B2 * 1/2003   Makino et al. ............. 428/210

FOREIGN PATENT DOCUMENTS

| EP | 0 285 127 A2 | 10/1988 |
| JP | 53-124772 A1 | 10/1978 |
| JP | 55-121294 A  | 9/1980  |
| JP | 57-206088 A  | 12/1982 |
| JP | 1-205053 A   | 8/1989  |
| JP | 1-209783 A   | 8/1989  |
| JP | 3-280491 A   | 12/1991 |
| JP | 2001-206781  | 7/2001  |
| JP | 2001-342080  | 12/2001 |

OTHER PUBLICATIONS

"Electronic Ceramics", Dec. 1991.
U.S.S.N. 09/769,751 filed Jan. 26, 2001.
XP–002166841—English Abstract (Aug. 11, 1983).
XP–002166842—English Abstract (Jul. 31, 1973).
XP–002166843—English Abstract (Dec. 17, 1985).
European Search Report dated May 22, 2001.

* cited by examiner

Primary Examiner—Deborah Jones
Assistant Examiner—Vivek Koppikar
(74) Attorney, Agent, or Firm—Sughrue Mion, PLLC

(57) ABSTRACT

A process for producing a ceramic member for bonding, which comprises: a first step of preparing a lower layer paste with the use of a first mixture comprising nickel, tungsten and molybdenum, applying the lower layer paste to a surface of a ceramic base which is a sintered ceramic, and drying the resultant coating layer to form a lower layer after the applying; a second step of preparing an upper layer paste with the use of a second mixture comprising one of nickel and nickel oxide and at least one of copper, copper oxide, manganese and manganese oxide, applying the upper layer paste to the lower layer, and drying the resultant coating layer to form an upper layer after the applying; and a third step of heating the lower layer and the upper layer to bake the lower layer and the upper layer.

15 Claims, 15 Drawing Sheets

PROCESS FOR PRODUCING CERAMIC MEMBER FOR BONDING, CERAMIC MEMBER FOR BONDING, VACUUM SWITCH, AND VACUUM VESSEL

FIELD OF THE INVENTION

The present invention relates to a member required to have bonding strength, airtightness and other properties as in the case of bonding a metal to a ceramic. More particularly, the invention relates to a process for producing a ceramic member for bonding, a ceramic member for bonding, a bonded object, a vacuum switch, and a vacuum vessel.

BACKGROUND OF THE INVENTION

The molybdenum-manganese method (Mo—Mn method; Telefunken method) has conventionally been known as a method for metallizing a surface of a ceramic base.

This Mo—Mn method comprises applying a metallizing ink prepared by adding a bonding aid such as Mn powder, Ti powder and glass ingredient ($SiO_2$) to a powder of high-melting metal such as tungsten and molybdenum and mixing the powder mixture with an organic binder to make a paste to a ceramic base, and then baking the ink layer (baking method).

SUMMARY OF THE INVENTION

The technique of the related art described above necessitates a baking temperature as high as from 1,300 to 1,500° C. for metallization and, hence, has had a problem that the sintering cost regarding furnace structure, utilities, expendable heat-resistant materials, etc. is high.

Another problem is that the ceramic itself deforms in the high-temperature baking, resulting in a product which does not satisfy dimensional accuracy.

Although a measure in overcoming the problem described above may be to bake a metallizing ink having a conventional composition at a temperature lower than 1,300° C., this low-temperature baking poses a problem that a sufficient bonding strength cannot be obtained.

Furthermore, in the case where a metallic layer formed by metallization by the Mo—Mn method is to be bonded to another metallic member or the like by brazing, it is necessary to improve the wettability thereof by a brazing material so as to obtain satisfactory bonding. Although it is hence inevitable to conduct post-treatments such as nickel plating and subsequent sintering, there has been a problem that these post-treatments make the production process complicated.

Further, in recent years, a technique has been proposed which comprises applying a tungsten paste to a ceramic base to form a lower layer (sublayer), applying a nickel paste to the lower layer, baking the coated material, and then subjecting the material directly to brazing for the purpose of reducing the number of steps (see "Electronic Ceramics", December 1991). However, this technique leaves something to be desired because it requires a baking temperature as high as not lower than 1,250° C., adding to the sintering cost and deteriorating the dimensional accuracy of the resulting ceramic product.

The invention has been worked out in order to solve the aforementioned problems. An aim of the invention is to provide a process for producing a ceramic member for bonding which enables low-temperature sintering and simplified production process and gives a high dimensional accuracy, and a ceramic member for bonding, a bonded object, a vacuum switch and a vacuum vessel produced thereby.

(1) In order to accomplish the aforementioned aim of the invention, the first essence of the invention lies in a process for producing a ceramic member for bonding, which comprises:

A first step of applying a lower layer paste prepared from a first mixture comprising nickel, tungsten and molybdenum to the surface of a ceramic base which is a sintered ceramic, and then drying the coating layer to form a lower layer;

A second step of applying an upper layer paste prepared from a second mixture of nickel or nickel oxide and at least one of copper, copper oxide, manganese and manganese oxide to the lower layer, and then drying the coating layer to form an upper layer; and A third step of heating and baking the lower layer and the upper layer.

In the invention, a mechanism of bonding of a Mo—W—Ni layer which is a lower layer to a ceramic base is formed. For the aforementioned baking (i.e., sintering the lower layer and the upper layer by calcining), the addition of Nickel causes the acceleration of sintering of Molybdenum particles, enabling low temperature sintering. Further, since the lower layer paste comprises tungsten incorporated therein, the sintering rate of Molybdenum particles can be relaxed to accomplish fair bonding over a wide temperature range.

Moreover, in the invention, a mechanism of bonding of a Ni—(Cu, Mn) layer which is an upper layer to a Mo—W—Ni layer which is a lower layer is formed. For the aforementioned baking, the incorporation of copper or manganese in the upper layer causes the drop of melting point of nickel, making it possible to form a dense alloy layer on the lower layer. In this arrangement, fair brazing can be effected even without nickel plating and subsequent sintering. Further, since the upper layer is an alloyed layer, the excessive diffusion of nickel in the lower layer containing molybdenum can be lessened, making it possible to prevent strength drop due to oversintering of molybdenum.

In the invention, the aforementioned action allows omission of nickel plating and sintering therefor, which has heretofore been required, making it possible to drastically simplify the production process and hence drastically reduce the production cost. Further, the lower layer and the upper layer can be sintered at a temperature as low as not higher than 1,200° C., the sintering cost regarding furnace structure, utilities, expendable heat-resistant materials, etc. can be reduced. Moreover, the low temperature sintering makes it difficult for the ceramic itself to deform and hence makes it possible to obtain a high dimensional accuracy.

The lower layer paste can be prepared by mixing a first mixture containing a nickel powder, a tungsten powder and a molybdenum powder with an organic binder. The upper layer paste can be prepared by mixing a second mixture containing a nickel powder or nickel oxide powder with at least one of a copper powder, copper oxide powder, manganese powder and manganese oxide powder or a second mixture containing a nickel-copper alloy powder or nickel-manganese alloy powder with an organic binder.

When baking at the third step is effected in a humidifying reducing atmosphere such as $H_2$ and $H_2/N_2$, particularly at a temperature of from 1,080° C. to 1,200° C., the resulting product has a high bonding strength and airtightness to advantage.

(2) The second essence of the invention lies in the aforementioned process for producing a ceramic member for bonding, wherein the first mixture comprises nickel, tungsten and molybdenum incorporated therein in an amount of from 1% to 10% by weight, from 20% to 69% by weight and from 30% to 69% by weight, respectively.

In the invention, since the content of nickel in the first mixture is not lower than 1% by weight, nickel reacts with molybdenum, which is a high melting metal, to accelerate sintering of the lower layer (metallic layer). In this manner, sintering can be thoroughly effected even at low temperatures. Further, since the content of nickel in the first mixture is not greater than 10% by weight, oversintering of molybdenum can be prevented, making it possible to prevent the lack of strength of bonding between the ceramic base and the metallic layer.

Moreover, since the content of tungsten in the first mixture is not lower than 20% by weight, the temperature range within which a high strength metallic layer can be formed is wide. Further, since the content of tungsten in the first mixture is not greater than 69% by weight, the incorporation of molybdenum and nickel exerts an effect of preventing undersintering at low temperatures.

Further, since the content of molybdenum in the first mixture is not lower than 30% by weight, a firm metallic layer can be formed at low temperatures. Moreover, since the content of molybdenum in the first mixture is not greater than 69% by weight, the incorporation of tungsten and nickel can exert a good effect.

Examples of materials other than the metallic ingredients of the lower layer paste include organic binder.

(3) The third essence of the invention lies in the process for producing a ceramic member for bonding according to the first or second essence of the invention, wherein the first mixture further comprises a silicon oxide component incorporated therein in an amount of from 2% to 15% by weight.

In the invention, since the first mixture comprises a silicon oxide ($SiO_2$) ingredient incorporated therein in an amount of from 2% to 15% by weight, the resulting airtightness can be improved.

(4) The fourth essence of the invention lies in the process for producing a ceramic member for bonding according to any one of the first to third essences of the invention, wherein the second mixture comprises nickel or nickel oxide and at least one of copper, copper oxide, manganese and manganese oxide incorporated therein in an amount of from 35% to 75% by weight and from 25% to 65% by weight, respectively.

In the invention, since the content of nickel or nickel oxide in the second mixture is from 35% to 75% by weight, the resulting ceramic member for bonding exhibits an enhanced bonding strength and an excellent airtightness.

Further, since the content of at least one of copper, copper oxide, manganese and manganese oxide in the second mixture is not lower than 25% by weight, the resulting ceramic member for bonding exhibits an enhanced brazability and bonding strength. Moreover, since the content of at least one of copper, copper oxide, manganese and manganese oxide in the second mixture is not greater than 65% by weight, the lack of strength between the ceramic base and the metallic layer due to penetration of these ingredients into the metallic layer can be prevented.

Examples of materials other than the metal and metal oxide ingredients of the upper layer include organic binder.

When the content of the silicon oxide ingredient in the second mixture is from 2% to 10% by weight, the resulting ceramic member for bonding exhibits an even higher airtightness.

(5) The fifth essence of the invention lies in a ceramic member for bonding, comprising:
A metallic layer which is a lower layer comprising nickel, tungsten and molybdenum provided on the surface of a ceramic base which is a sintered ceramic; and
An alloy layer which is an upper layer comprising nickel and at least one of copper and manganese provided on the surface of the metallic layer with or without an interlayer interposed therebetween.

In the invention, since the incorporation of nickel allows the acceleration of sintering of molybdenum particles in the lower layer, the lower layer can be sintered at low temperatures. Further, the incorporation of tungsten allows the relaxation of the sintering rate of molybdenum particles, making it possible to provide an excellent bonding over a wide temperature range.

Moreover, the incorporation of copper and manganese in addition to nickel in the upper layer causes the drop of melting point of nickel, making it possible to form a dense alloy layer on the upper layer. In this arrangement, fair brazing can be effected without nickel plating or the like. Further, since the upper layer is an alloy layer, excessive diffusion of nickel in the lower layer, which comprises molybdenum incorporated therein, can be lessened, making it possible to prevent the drop of strength due to oversintering of molybdenum.

In the invention, the aforementioned action allows the omission of nickel plating and subsequent sintering, which have heretofore been required, making it possible to drastically simplify the working procedure and hence drastically reduce the production cost. Further, the composition of the invention can be sintered at low temperatures, making it possible to reduce the sintering cost regarding furnace structure, utilities, expendable heat-resistant materials, etc. Moreover, the low temperature sintering makes it difficult for the ceramic to deform, thereby giving a high dimensional accuracy. In addition, sintering can be thoroughly effected at low temperatures, a high bonding strength can be secured.

While the alloy layer which is an upper layer maybe formed directly on the metallic layer which is a lower layer, an interlayer having a different constitution from that of these layers may be formed interposed therebetween.

(6) The sixth essence of the invention lies in the ceramic member for bonding according to the fifth essence of the invention, wherein the metallic layer comprises nickel, tungsten and molybdenum in an amount of from 0.7% to 8% by weight, from 15% to 75% by weight and from 20% to 80% by weight, respectively.

In the invention, since the content of nickel in the metallic layer is not smaller than 0.7% by weight, sintering can be thoroughly effected at low temperatures. Further, since the content of nickel in the first mixture is not greater than 10% by weight, oversintering of molybdenum can be prevented, making it possible to prevent the lack of strength of bonding between the ceramic base and the metallic layer.

Further, since the content of tungsten is not lower than 15% by weight, the temperature range within which a firm metallic layer can be formed is wide. Moreover, since the content of tungsten is not greater than 75% by weight, the incorporation of molybdenum and nickel can exert a good effect.

Further, the metallic layer comprises molybdenum incorporated therein in an amount of from 20% to 80% by weight and thus forms a firm metallic layer.

(7) The seventh essence of the invention lies in the ceramic member for bonding according to the fifth or sixth essence of the invention, wherein the metallic layer further comprises a silicon oxide component incorporated therein in an amount of from 3% to 18% by weight as calculated in terms of oxide.

In the invention, since the metallic layer comprises a silicon oxide component incorporated therein in an amount of from 3% to 18% by weight, the adhesion between the ceramic member and the metallic layer is extremely high, enhancing airtightness.

(8) The eighth essence of the invention lies in the ceramic member for bonding according to any one of the fifth to seventh essences of the invention, wherein the alloy layer comprises nickel, copper and manganese incorporated therein in an amount of from 10% to 75% by weight, from 20% to 85% by weight and from 5% to 40% by weight, respectively.

In the invention, the alloy layer comprises nickel in an amount of from 10% to 75% by weight and thus exhibits a bonding strength with the metallic layer and a high airtightness.

Further, since the content of copper is not smaller than 20% by weight, the resulting alloy layer exhibits an excellent brazability and a high strength. Moreover, since the content of copper is not smaller than 85% by weight, it contributes to the enhancement of the strength of bonding of the ceramic base to the metallic layer.

When the aforementioned alloy layer further comprises a silicon oxide component incorporated therein in an amount of from 0.05 to 1.0 parts by weight as calculated in terms of oxide, the adhesion between the ceramic member and the metallic layer is extremely high to enhance the airtightness.

(9) The ninth essence of the invention lies in the ceramic member for bonding according to any one of the fifth to eighth essences of the invention, wherein the interlayer provided interposed between the metallic layer which is a lower layer and the alloy layer which is an upper layer is an interlayer formed by a nickel-molybdenum alloy.

The invention constitutes exemplification of the ingredients of the interlayer. This interlayer may be formed under some sintering conditions. In the case where the interlayer exists, there occurs little change in properties such as bonding strength.

(10) The tenth essence of the invention lies in a bonded object comprising a metallic member bonded to a ceramic member for bonding according to any one of the fifth to ninth essences of the invention with at least the metallic layer and the alloy layer provided interposed therebetween.

In the invention, a ceramic member for bonding and a metallic member are bonded to each other with the aforementioned metallic layer and alloy layer provided interposed therebetween. In some detail, a metallic member is bonded with, e.g., a brazing material to the alloy layer of a ceramic member for bonding prepared by forming a metallic layer on the surface of a ceramic base, and then forming an alloy layer thereon. The aforementioned interlayer may be provided interposed between the metallic layer and the alloy layer.

Accordingly, nickel plating (on the surface of the metallic layer) and subsequent sintering as conventionally effected are not necessary, making it possible to braze the metallic member directly to the alloy layer. This reduces the number of production steps and hence the production cost. Further, this bonded object has a high bonding strength and a high dimensional accuracy.

(11) The eleventh essence of the invention lies in a bonded object comprising another ceramic member for bonding bonded to a ceramic member for bonding according to any one of the fifth to ninth essences of the invention with at least the metallic layer and the alloy layer provided interposed therebetween.

In the invention, a ceramic member for bonding and another ceramic member for bonding are bonded to each other with the aforementioned metallic layer and alloy layer provided interposed therebetween. The aforementioned interlayer may be provided interposed between the metallic layer and the alloy layer.

An example of such an arrangement is a bonded object having two ceramic members for bonding comprising a metallic layer and an alloy layer formed thereon bonded to each other at the alloy layer thereof with a brazing material.

Accordingly, as in the tenth essence of the invention, nickel plating and subsequent sintering as conventionally effected are not necessary, making it possible to braze the metallic member directly to the alloy layer. This reduces the number of production steps and hence the production cost. Further, this bonded object has a high bonding strength and a high dimensional accuracy.

(12) The twelfth essence of the invention lies in a vacuum switch comprising a bonded object according to the tenth or eleventh essence of the invention.

The invention concerns a vacuum switch comprising the aforementioned bonded object. An example of this vacuum switch is an electric circuit switch comprising a ceramic insulating valve suitable particularly for switching of high-voltage large-current electricity.

(13) The thirteenth essence of the invention lies in a vacuum vessel comprising a bonded object according to the tenth or eleventh essence of the invention.

The invention concerns a vacuum vessel (e.g., insulating valve) used in the aforementioned vacuum switch, etc. A vacuum switch (electrical circuit switch) can be fabricated by disposing electrodes and other necessary members in this vacuum vessel.

In the case where there is contained the aforementioned silicon oxide component, the proportion of other ingredients of the various essences of the invention (metals and oxide thereof) may be properly adjusted within their predetermined range such that the sum of the content of all these ingredients is 100% by weight depending on the content of the silicon oxide component.

DESCRIPTION OF THE REFERENCE NUMERALS AND SIGNS

Figure 1:
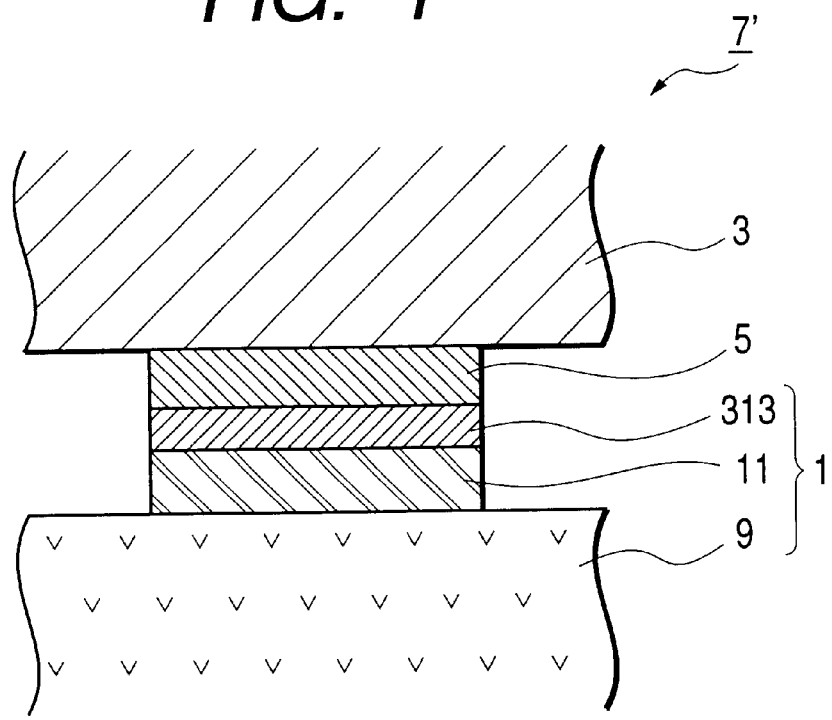
FIG. 1 is a sectional view illustrating the bonded object of Example 1 with its essential part shown broken.

1 . . . Ceramic member for bonding
3 . . . Metallic member
5, 35, 162, 219, 221 . . . Brazing material
7, 7', 37, 37', 70, 370 . . . Bonded object
9 . . . Ceramic base
11, 171, 211, 213 . . . Metallic layer
13 . . . Deposit layer formed by metallization
313, 373, 315, 317 . . . Alloy layer
31 . . . First ceramic member for bonding
33 . . . Second ceramic member for bonding
39 . . . First ceramic base
41 . . . First metallic layer formed by metallization
343 . . . First alloy layer
45 . . . Second ceramic base
47 . . . Second metallic layer formed by metallization
349 . . . Second alloy layer
161, 207 . . . Arc shield
101 . . . Insulating valve
100, 100', 100'', 200, 200', 200'' . . . Vacuum switch (high-load switch)
201 . . . Upper insulating valve
203 . . . Lower insulating valve
205 . . . Connecting member

DETAILED DESCRIPTION OF THE INVENTION

Embodiments (examples) of the process for producing a ceramic member for bonding, the ceramic member for bonding, the bonded object, the vacuum switch and the vacuum vessel of the invention will be described in connection with the drawings.

EXAMPLE 1

A bonded object ceramic member for bonding and a metallic member will be described hereinafter by way of example.

a) As diagrammatically shown in FIG. 1, a ceramic member for bonding 1 and a metallic member 3 are bonded to each other with a brazing material 5 to form a bonded object 7' in the present example.

More specifically, the ceramic member for bonding 1 comprises a metallic layer (lower layer) 11 formed on a ceramic base 9 by metallization. An alloy layer (upper layer) 313 is formed on the metallic layer 11. The alloy layer 313 and the metallic member 3 are bonded to each other with the brazing material 5, whereby the ceramic member for bonding 1 and the metallic member 3 are integrated.

In particular, in the present example, the metallic layer 11 comprises nickel in an amount of from 0.5% to 8% by weight, tungsten in an amount of from 15% to 75% by weight, molybdenum in an amount of from 18% to 81% by weight and $SiO_2$ in an amount of from 1.4% to 19% by weight as calculated in terms of oxide. Further, the alloy layer 313 comprises nickel and copper (or manganese) in an amount of from 12% to 76% by weight and from 19% to 87% by weight (or from 2% to 42%), respectively.

Accordingly, as obedient from the experiment example described later, the bonded object 7' of the present example exhibits a high strength of bonding between the ceramic base 9 and the metallic layer 11 and hence an excellent airtightness.

Further, since brazing can be effected with the metallic member 3 on the alloy layer 313 without nickel plating and subsequent sintering as conventionally effected, the production process can be drastically simplified.

b) A process for producing a ring-shaped test piece as an example of this bonded object 7' will be described hereinafter together with a process for producing a ceramic member for bonding 1.

(1) Firstly, a second mixture was prepared from materials selected from nickel powder, copper powder, manganese powder, molybdenum powder, nickel-copper alloy powder and nickel-manganese alloy powder set forth in Table 1 below. The second mixture powder (having a concentration of, e.g., 87% by weight) was pulverized and mixed with an organic binder (having a concentration of, e.g., 13% by weight) such as ethyl cellulose to prepare a lower layer paste (first metallizing ink).

The first mixture comprises nickel, tungsten and molybdenum incorporated therein as metallic ingredients in an amount of from 0.5% to 10% by weight, from 20% to 70% by weight and from 20% to 70% by weight, respectively.

(2) Similarly, a second mixture was prepared from materials selected from nickel powder, copper powder, molybdenum powder, nickel-copper alloy powder and nickel-manganese alloy powder set forth in Table 1 below. The second mixture powder (having a concentration of, e.g., 87% by weight) was pulverized and mixed with an organic binder (having a concentration of, e.g., 13% by weight) such as ethyl cellulose to prepare an upper layer paste (second metallizing ink).

The second mixture comprises nickel or nickel oxide and at least one of copper, copper oxide and manganese oxide as a metal or metal oxide ingredient in an amount of from 30% to 80% by weight and from 20% to 70% by weight, respectively.

(3) Subsequently, the aforementioned lower layer paste was applied to a ceramic base 9 (cylindrical test piece having a thickness of 5 mm, an outer diameter of 5 mm and an inner diameter of 8.5 mm) made of alumina (having an alumina concentration of, e.g., 92% by weight) which is a sintered ceramic to a thickness of from about 10 μm to 20 μm, and then dried to form a lower layer (which later becomes a metallic layer 11).

(4) Subsequently, the aforementioned upper layer paste was applied to the entire surface of the lower layer to a thickness of from about 10 μm to 20 μm, and then dried to form an upper layer (which later becomes an alloy layer 313).

(5) Subsequently, the ceramic base 9 having the aforementioned upper layer and lower layer formed thereon was placed in a furnace where it was then sintered at a temperature of from 1,050 to 1,250° C. as shown in Table 2 below in an atmosphere of $H_2/N_2$ (1:1) forming gas having a wetter temperature of 40° C. As a result, a ceramic member for bonding 1 was obtained which consisted of the ceramic base 9 and a metallic layer 11 and an alloy layer 313 formed thereon by metallization.

(6) Subsequently, the ceramic member for bonding 1 and a metallic member 3 made of Kovar (Fe—Ni—Co) were brazed together.

Specifically, a foil of a solver brazing material (BAg-8) was disposed interposed between the alloy layer 313 and the metallic member 3 (e.g., a Kovar disk having a thickness of 1 mm and an outer diameter ϕ of 16 mm). This assemblage was heated at a predetermined brazing temperature and then cooled to braze the ceramic member for bonding 1 and the metallic member 3 together. Thus, a bonded object 7' was completed.

Figure 2:
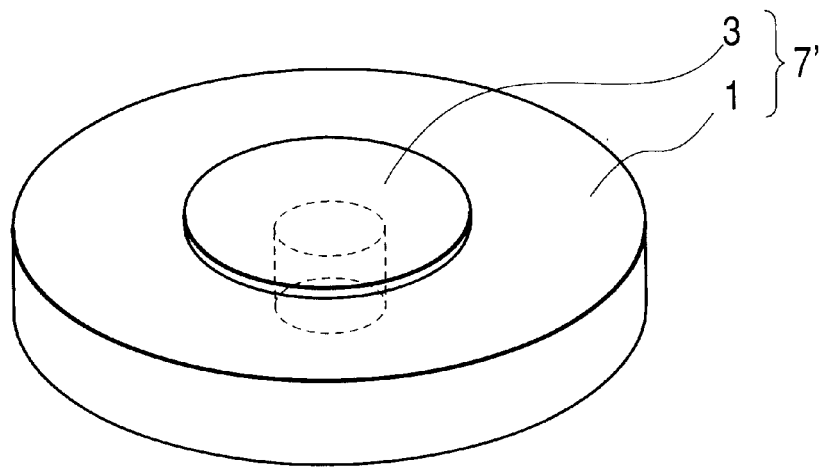
FIG. 2 is a slant view illustrating the bonded object of Example 1.

In some detail, using the first and second mixtures (i.e., lower layer paste and upper layer paste) having different compositions as set forth in Table 1 below, ring-shaped test pieces (samples of the invention comprising tungsten incorporated in the lower layer and nickel ingredient and copper or manganese ingredient incorporated in the upper layer) were produced as bonded objects 7' to be tested as shown in FIG. 2 through the steps (1) to (6) described above.

Comparative Sample Nos. 22 to 25 (samples free of copper and manganese in the upper layer and free of tungsten in the lower layer) were further produced using pastes having different compositions. Table 1 shows the composition of the first and second mixtures.

TABLE 1

| Sample No. | Lower layer paste (for metallic layer) | | | | Upper layer paste (for alloy layer) | | | | Remarks |
|---|---|---|---|---|---|---|---|---|---|
| | Mo | W | Ni | $SiO_2$ | Ni | Cu | Mn | Mo | |
| 1 | 20 | 70 | 5 | 5 | 50 | 50 | — | — | Example of the first essence |
| 2 | 29 | 70 | 1 | 0 | 50 | 50 | — | — | Example of the first essence |
| 3 | 30 | 69 | 1 | 0 | 50 | 50 | — | — | Example of the second essence |
| 4 | 30 | 60 | 5 | 5 | 50 | 50 | — | — | Example of the second essence |
| 5 | 69 | 20 | 5 | 6 | 50 | 50 | — | — | Example of the second essence |
| 6 | 69 | 18 | 6 | 7 | 50 | 50 | — | — | Example of the first essence |
| 7 | 70 | 20 | 5 | 5 | 50 | 50 | — | — | Example of the first essence |
| 8 | 44.5 | 50 | 0.5 | 5 | 50 | 50 | — | — | Example of the first essence |
| 9 | 44 | 50 | 1 | 5 | 50 | 50 | — | — | Example of the second essecne |
| 10 | 35 | 50 | 10 | 5 | 50 | 50 | — | — | Example of the second essence |
| 11 | 48 | 50 | 1 | 1 | 50 | 50 | — | — | Example of the second essence |
| 12 | 40 | 35 | 10 | 15 | 50 | 50 | — | — | Example of the second essence |
| 13 | 35 | 35 | 10 | 20 | 50 | 50 | — | — | Example of the second essence |
| 14 | 45 | 45 | 5 | 5 | 30 | 70 | — | — | Example of the first essence |
| 15 | 45 | 45 | 5 | 5 | 40 | 60 | — | — | Example of the second essence |
| 16 | 45 | 45 | 5 | 5 | 70 | 30 | — | — | Example of the second essence |
| 17 | 45 | 45 | 5 | 5 | 80 | 20 | — | — | Example of the first essence |
| 18 | 45 | 45 | 5 | 5 | 30 | — | 70 | — | Example of the first essence |
| 19 | 45 | 45 | 5 | 5 | 40 | — | 60 | — | Example of the second essence |
| 20 | 45 | 45 | 5 | 5 | 70 | — | 30 | — | Example of the second essence |
| 21 | 45 | 45 | 5 | 5 | 80 | — | 20 | — | Example of the first essence |
| 22 | 45 | 45 | 5 | 5 | 30 | — | — | 70 | Comparative Example |
| 23 | 45 | 45 | 5 | 5 | 50 | — | — | 50 | Comparative Example |
| 24 | 45 | 45 | 5 | 5 | 70 | — | — | 30 | Comparative Example |
| 25 | 90 | — | 5 | 5 | 50 | 50 | — | — | Comparative Example | c) The ceramic members for bonding 1 thus prepared were each polished on the section thereof. The section of the ceramic members 1 for bonding were each then quantitatively analyzed for the components of the metallic layer 11 and the alloy layer 313. In some detail, the quantitative analysis was conducted using an electron probe microanalyzer (accelerating voltage: 20 kv; spot diameter: 5 μm). The results are set forth in Table 2 below.

With respect to each sample, the analysis was made on five points so as to reduce influences of segregation and the five found values obtained for each component were averaged. In Table 2 below, the content of silicon (% by weight) is represented in term of oxide. The other constituents of each layer are glass ingredients such as $Al_2O_3$, MgO and CaO diffused from the ceramic base.

TABLE 2

Found value after sintering (average) [wt-%]

| Sample No. | Lower layer (metallic layer) | | | | Upper layer (alloy layer) | | | | Remarks |
| --- | --- | --- | --- | --- | --- | --- | --- | --- | --- |
| | Mo | W | Ni | SiO$_2$ | Ni | Cu | Mn | Mo | |
| 1 | 18.3 | 75.6 | 1.5 | 4.1 | 33.5 | 64.4 | — | 0.6 | Example of the first essence |
| 2 | 20.1 | 76.1 | 0.8 | 2.2 | 34.4 | 62.2 | — | 0.7 | Example of the first essence |
| 3 | 22.8 | 74.3 | 0.7 | 1.5 | 35.1 | 63.8 | — | 0.6 | Example of the second essence |
| 4 | 22.7 | 73.1 | 0.8 | 3.0 | 17.0 | 79.3 | — | 0.1 | Example of the second essence |
| 5 | 76.2 | 15.7 | 3.2 | 2.5 | 13.2 | 80.9 | — | 0.6 | Example of the second essence |
| 6 | 77.0 | 14.5 | 3.4 | 3.1 | 21.6 | 74.5 | — | 1.8 | Example of the first essence |
| 7 | 81.3 | 15.0 | 1.9 | 1.7 | 31.0 | 64.5 | — | 1.7 | Example of the first essence |
| 8 | 58.6 | 33.4 | 0.5 | 3.8 | 35.1 | 62.1 | — | 1.9 | Example of the first essence |
| 9 | 52.1 | 40.0 | 1.4 | 4.0 | 34.2 | 62.9 | — | 1.7 | Example of the second essence |
| 10 | 58.5 | 28.5 | 7.8 | 3.9 | 37.5 | 59.8 | — | 2.0 | Example of the second essence |
| 11 | 60.1 | 33.0 | 1.8 | 2.7 | 26.2 | 69.3 | — | 2.5 | Example of the second essence |
| 12 | 52.4 | 24.5 | 4.4 | 16.0 | 27.8 | 69.8 | — | 1.2 | Example of the second essence |
| 13 | 46.1 | 27.8 | 4.8 | 19.0 | 39.9 | 57.9 | — | 1.7 | Example of the second essence |
| 14 | 62.4 | 24.6 | 5.6 | 3.9 | 12.0 | 87.0 | — | 0.8 | Example of the first essence |
| 15 | 60.3 | 31.6 | 3.4 | 2.9 | 12.7 | 81.1 | — | 0.5 | Example of the second essence |
| 16 | 61.0 | 30.0 | 1.6 | 4.7 | 57.8 | 35.3 | — | 4.8 | Example of the second essence |
| 17 | 57.3 | 31.8 | 7.1 | 1.4 | 72.0 | 18.5 | — | 7.7 | Example of the first essence |
| 18 | 55.0 | 30.7 | 4.3 | 5.0 | 31.4 | — | 42.3 | 22.1 | Example of the first essence |
| 19 | 59.2 | 30.0 | 4.4 | 3.6 | 40.0 | — | 31.7 | 23.2 | Example of the second essence |
| 20 | 57.2 | 31.0 | 6.3 | 2.8 | 68.2 | — | 6.1 | 23.5 | Example of the second essence |
| 21 | 60.0 | 24.8 | 6.7 | 3.8 | 76.5 | — | 2.3 | 20.2 | Example of the first essence |
| 22 | 61.7 | 24.1 | 7.0 | 2.3 | 27.5 | — | — | 65.8 | Comparative Example |
| 23 | 64.8 | 20.0 | 7.1 | 2.5 | 44.0 | — | — | 50.6 | Comparative Example |
| 24 | 60.3 | 27.9 | 6.4 | 3.0 | 60.9 | — | — | 33.3 | Comparative Example |
| 25 | 91.4 | — | 2.8 | 3.0 | 45.3 | 45.8 | — | 4.0 | Comparative Example | d) Subsequently, the bonded objects 7' produced by the process described above were examine for bonding strength.

Figure 3:
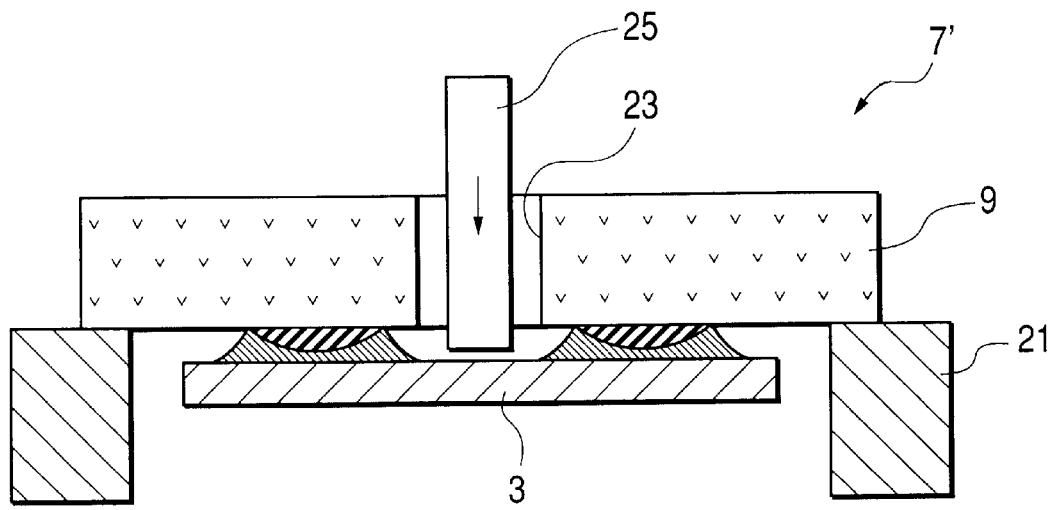
FIG. 3 is a view illustrating a method for measuring the bonding strength of the bonded object of Example 1.

In some detail, as shown in FIG. 3, each bonded object 7' was placed in such an arrangement that the metallic member 3 faced downward and the lower side of a peripheral part of the ceramic base 9 was supported on a cylindrical iron pedestal 21. A cylindrical punching rod 25 made of stainless steel was inserted from the upper side into the central through-hole 23 of the ceramic base 9 held in that state. The punching rod 25 was then moved downward as viewed in the drawing at a rate of 0.5 mm/min.

The strength (breaking strength) developed when the metallic member 3 separated from the ceramic base 9 was measured with a load cell (not shown) disposed over the punching rod 25. This strength was taken as brazing strength. With respect to each sample, the brazing strengths for the respective sintering temperatures are set forth in Table 3 below.

In the column "Evaluation of bonding strength and obtained data" in Table 3, "⊚" indicates that the sample had a bonding strength of not lower than 20 MPa, "○" indicates that the sample had a bonding strength of from not lower than 15 MPa to lower than 20 MPa, "Δ" indicates that the sample had abonding strength of from not lower than 10 MPa to lower than 15 MPa, and "X" indicates that the sample had a bonding strength of lower than 10 MPa. In addition, bonding strength data of each of the samples are shown in parentheses "( )" at the column "Evaluation of bonding strength and obtained data".

TABLE 3

| Sample No. | Evaluation of bonding strength and obtained data [MPa] Sintering temperature [° C.] | | | | |
| --- | --- | --- | --- | --- | --- |
| | 1,050 | 1,100 | 1,150 | 1,200 | 1,250 |
| 1 | X (2.8) | Δk (12.5) | ⊚k (21.1) | ○k (16.9) | X (1.0) |
| 2 | X (1.2) | Δ (14.1) | ⊚k (20.5) | ○k (15.3) | X (3.8) |

TABLE 3-continued

| Sample No. | Evaluation of bonding strength and obtained data [MPa] Sintering temperature [° C.] | | | | |
| --- | --- | --- | --- | --- | --- |
| | 1,050 | 1,100 | 1,150 | 1,200 | 1,250 |
| 3 | X (3.9) | ○ (18.5) | ⊚k (22.8) | ○k (16.6) | X (5.9) |
| 4 | X (4.8) | ○k (19.1) | ⊚k (24.3) | ○k (17.4) | X (4.9) |
| 5 | X (2.9) | ⊚k (21.5) | ⊚k (23.7) | ○k (17.4) | X (5.0) |
| 6 | X (2.0) | ⊚k (21.8) | ⊚k (20.3) | X (8.7) | X (1.1) |
| 7 | X (4.7) | ⊚k (20.4) | ⊚k (20.2) | X (7.5) | X (1.2) |
| 8 | X (1.7) | Δ (11.2) | ○k (17.4) | ○k (15.8) | X (6.8) |
| 9 | X (1.5) | ○k (17.3) | ○k (19.4) | ○k (16.7) | X (6.9) |
| 10 | Δ (10.9) | ⊚k (21.8) | ⊚k (21.5) | ○k (16.7) | X (1.2) |
| 11 | X (3.9) | ○ (15.6) | ○ (18.7) | ⊚k (20.8) | ○ (15.2) |
| 12 | Δ (11.2) | ⊚k (22.2) | ○k (17.9) | Δk (13.3) | X (2.9) |
| 13 | Δk (11.2) | ⊚k (22.0) | ⊚k (21.4) | Δ (13.4) | X (2.9) |
| 14 | X (3.0) | X (8.9) | ⊚k (18.3) | ○k (15.4) | Δ (10.7) |
| 15 | X (4.2) | ⊚k (22.8) | ⊚k (23.5) | ○k (16.9) | Δ (11.3) |
| 16 | Δ (12.5) | ⊚k (21.5) | ⊚k (22.9) | ○k (15.3) | Δ (11.0) |
| 17 | Δ (13.1) | ○k (17.2) | ○k (19.0) | X (9.2) | X (7.4) |
| 18 | X (3.0) | Δk (14.8) | ○k (18.1) | ○ (15.1) | X (6.0) |
| 19 | X (4.3) | ○k (18.4) | ⊚k (21.2) | ○k (16.0) | X (8.2) |
| 20 | X (5.3) | ⊚k (20.5) | ○k (19.1) | ○k (15.5) | X (7.9) |
| 21 | X (2.9) | ○k (15.4) | ○k (17.2) | X (8.3) | X (4.0) |
| 22 | X (2.0) | X (7.8) | Δk (13.9) | Δ (11.3) | X (2.3) |
| 23 | X (1.9) | X (6.9) | ○k (17.1) | Δ (10.7) | X (2.0) |
| 24 | X (2.5) | Δ (12.2) | ○k (19.0) | X (8.3) | X (1.9) |
| 25 | X (4.9) | ⊚k (20.5) | ○ (18.9) | X (7.4) | X (1.3) |

As can be seen in Table 3 above, Sample Nos. 1 to 21, which are within the scope of the invention, advantageously have a high brazing strength because the metallic layers formed by metallization have sufficiently sintered even through low-temperature sintering. There also is an advantage that since the metallic layers in those samples can be sufficiently sintered at low temperatures, the ceramic members for bonding can retain high dimensional accuracy as compared with the case where sintering is conducted at high temperatures.

It is also found that since the samples of the invention comprise tungsten incorporated in the lower layer, sintering can be conducted within a wide temperature range, making it possible to provide the sintered products obtained within the temperature range with high bonding properties.

In particular, Sample Nos. 3 to 5, 9 to 13, 15, 16, 19 and 20, which satisfy the requirements of the second and sixth essences of the invention, have a high bonding strength and thus are more desirable.

On the contrary, Sample Nos. 22 to 25, which are comparative, disadvantageously have a low brazing strength.

d) Subsequently, the samples of bonded object 7' produced by the process described above were each examined for airtightness.

In some detail, the air was evacuated from one side of the bonded object 7' shown in FIG. 3 (not higher than $1 \times 10^{-6}$ Pa). The other side of the bonded object 7' was filled with helium. In this arrangement, the bonded object 7' was then examined for leakage of helium.

In Table 3 above, the symbol "k" indicates that the sample had no leakage of helium.

As can be seen in Table 3 above, among Sample Nos. 1 to 21 of the invention, Sample Nos. 1, 4, 5, 9, 10, 12, 13, 16, 19 and 20 exhibit an excellent airtightness.

EXAMPLE 2

Example 2 will be described hereinafter. However, the description of the same points as in Example 1 will be omitted.

Figure 4:
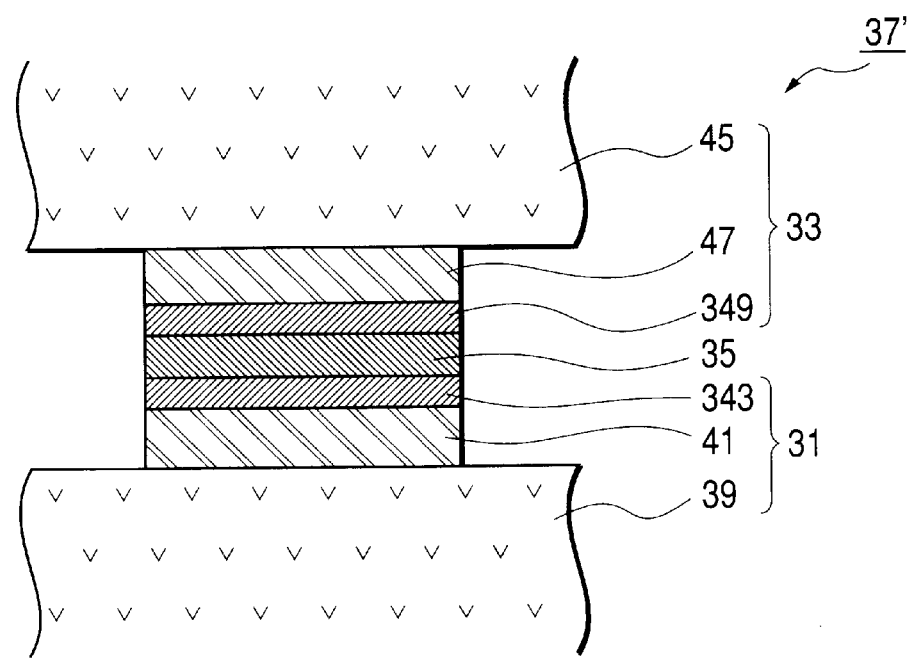
FIG. 4 is a sectional view illustrating the bonded object of Example 2 with its essential part shown broken.

In this example, a bonded object comprising two ceramic members bonded to each will be described as an embodiment.

a) As shown diagrammatically in FIG. 4, in the present example, a first ceramic member 31 made of alumina is bonded to a second ceramic member for bonding 33 made of alumina similar to the first ceramic member 31 made of alumina to form a bonded object 37'.

More specifically, the first ceramic member for bonding 31 comprises a first ceramic base 39 and a first metallic layer 41 formed thereon by metallization. A first alloy layer 343 is formed on this first metallic layer 41. On the other hand, the second ceramic member for bonding 33 comprises a second ceramic base 45 and a second metallic layer 47 formed thereon by metallization. A second alloy layer 349 is formed on this second metallic layer 47.

The first alloy layer 343 and the second alloy layer 349 are bonded to each other with a brazing material 35 to integrate the first ceramic member 31 for bonding and the second ceramic member 33 for bonding into one.

b) A process for producing the bonded object 37' will be described hereinafter together with processes for producing first ceramic member 31 for bonding and second ceramic member 33 for bonding.

(1) Using particulate upper layer paste ingredients set forth in Table 1 above, upper layer pastes for respective samples were produced in the same manner as in Example 1 (hereinafter, the points on which explanation is omitted here are the same as in Example 1).

(2) Subsequently, the lower layer pastes thus produced were each applied to a surface of a first ceramic base 39 and to a surface of a second ceramic base 45, and then dried to form a lower layer.

(3) Subsequently, the upper layer pastes thus produced were each applied to a surface of the lower layer of the first ceramic base 39 and the second ceramic base 45, and then dried to form an upper layer.

(4) Subsequently, the first and second ceramic bases 39 and 45 having the aforementioned upper layer and lower layer formed thereon, respectively, were each placed in a furnace where they were then sintered at a temperature of from 1,050 to 1,250° C. As a result, first and second ceramic members for bonding 31 and 33 were obtained having first and second alloy layers 343 and 349 deposited on the first and second metallic layers 41 and 47, respectively.

(5) Subsequently, a silver brazing material 35 was interposed between the two alloy layers 343 and 349 to braze the ceramic members for bonding 31 and 33 together. Thus, the ceramic members for bonding 31 and 33 were integrated to each other to complete a bonded object 37'.

The bonded object 37' of the present example exhibits a high bonding strength and hence an excellent airtightness as in Example 1.

EXAMPLE 3

Example 3 will be described hereinafter. However, the description of the same points as in Examples 1 and 2 will be omitted.

The present example describes application of a bonded object comprising a ceramic member for bonding and a metallic member, such as that shown in Example 1, to a vacuum switch as an embodiment.

This vacuum switch is a high-load switch which comprises a vacuum vessel having built-in electrodes and other components and is suitable for the switching of high-voltage large-current electricity.

Figure 5:
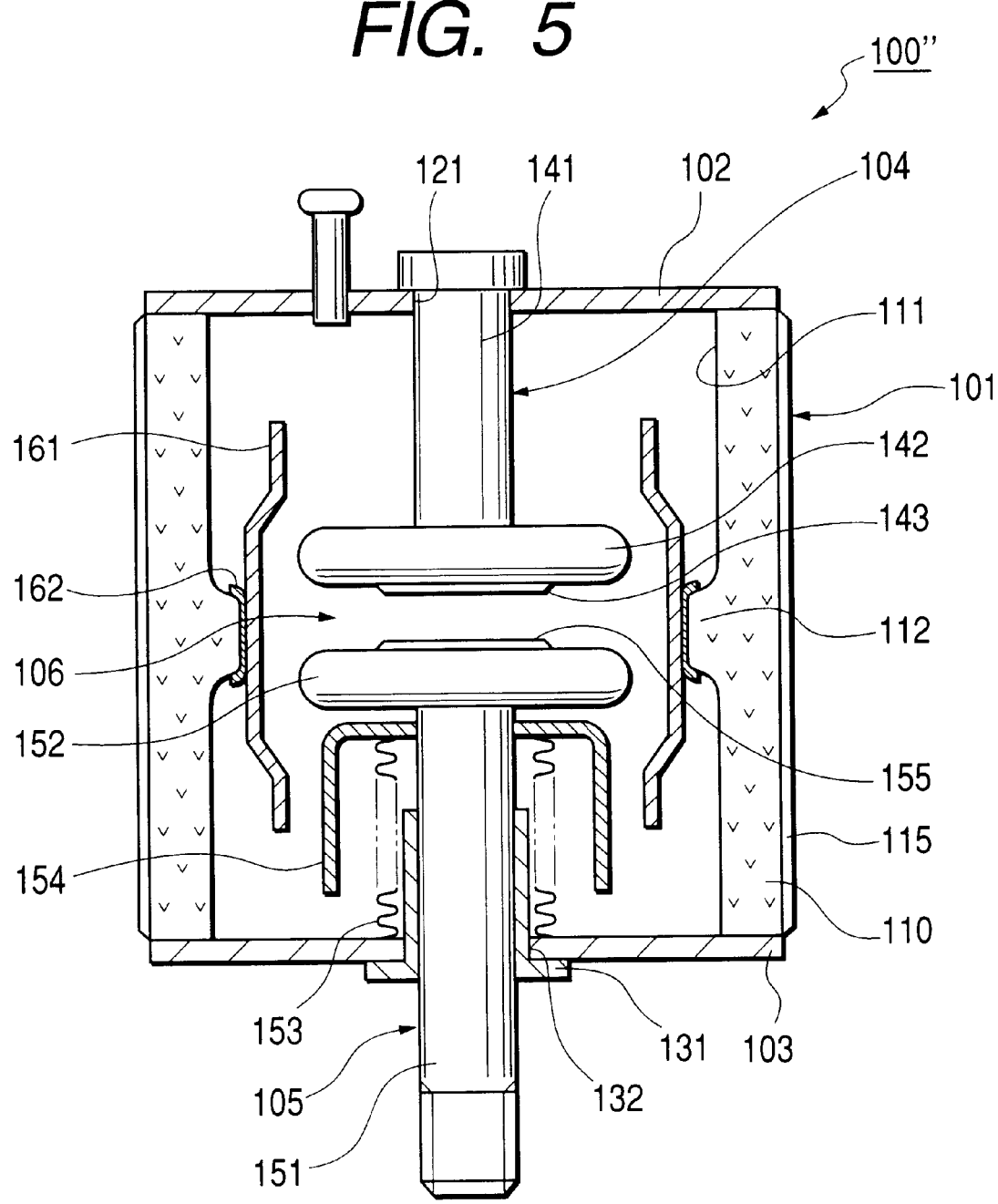
FIG. 5 is a partially cutaway view illustrating the vacuum switch of Example 3.

More specifically, as shown in FIG. 5, this high-load vacuum switch 100" comprises an insulating valve 101, first and second end covers 102 and 103 attached to the insulating valve 101 so as to cover the respective ends thereof, a fixed electrode 104 attached to the first endcover 102 and projecting into the insulating valve 101, and a movable electrode 105 disposed so as to be freely slidable through the second end cover 103. The fixed electrode 104 and the movable electrode 105 constitute a contact point 106.

The insulating valve 101 is a sintered ceramic which has an alumina content of 92% by weight and has a nearly cylindrical shape having an inner diameter of 80 mm, a wall thickness of about 5 mm, and a length of 100 mm. The insulating valve 101 comprises a straight barrel part 110 having a constant inner diameter and a ridge part 112 projecting inward from the inner circumferential wall 111 and extending throughout the circumference along a circle located intermediately between both ends of the barrel part 110. The insulating valve 101 further has a glaze layer 115 on the outer circumferential surface thereof.

The first and second end covers 102 and 103 are constituted of disk-shaped Kovar (Fe—Ni—Co) plates respectively having in the centers thereof holes 121 and 132 for securing the fixed electrode 104 and a guide 131 thereto. This guide 131 has been disposed so that the movable shaft 151 of the movable electrode 105 is readily slidable.

The fixed electrode 104 consists of a fixed shaft 141, as one end thereof, which is firmly fitted to the hole 121 and a disk-shaped electrode 142, as the other end thereof, which projects into the insulating valve 101.

The movable electrode 105 consists of the movable shaft 151, as a rear end part thereof, which slides within the guide 131 and an electrode 152, as a front end part thereof, which comes into contact with the electrode 142 of the fixed electrode 104. This movable electrode 105 is equipped with a metallic bellows 153 extending from that part of the movable shaft 151 which is near the electrode 152 to the second end cover 103. The bellows 153 enables the electrode 105 to perform its switching function while maintaining a vacuum.

The metallic bellows 153 is surrounded by a bellows cover 154 so as to be prevented from coming into direct contact with a metal vapor generating from the electrodes 142 and 152 (i.e., contacts 143 and 155 disposed on the front ends thereof) upon current switching.

The contact point 106 has such a structure that fusion bonding caused by a vacuum arc generated is less apt to occur. This has been accomplished by employing a high-melting tungsten-based metal sinter as the material of the contacts 143 and 155 where the electrodes 142 and 152 contact with each other.

Furthermore, an arc shield 161 is disposed so as to surround the contact point 106. This arc shield 161 has been bonded by brazing to the ridge part 112 of the insulating valve 101 in order to prevent the metal vapor from depositing on the inner circumferential wall 111 of the insulating valve 101 to reduce insulation.

Namely, like the bonded object of Example 1, the high-load switch 100" of this Example comprises the insulating valve 101, which is a ceramic member for bonding, and the arc shield 161, which is a metallic member, bonded by brazing with a brazing material 162 to the ridge part 112 of the insulating valve 101.

Figure 6:
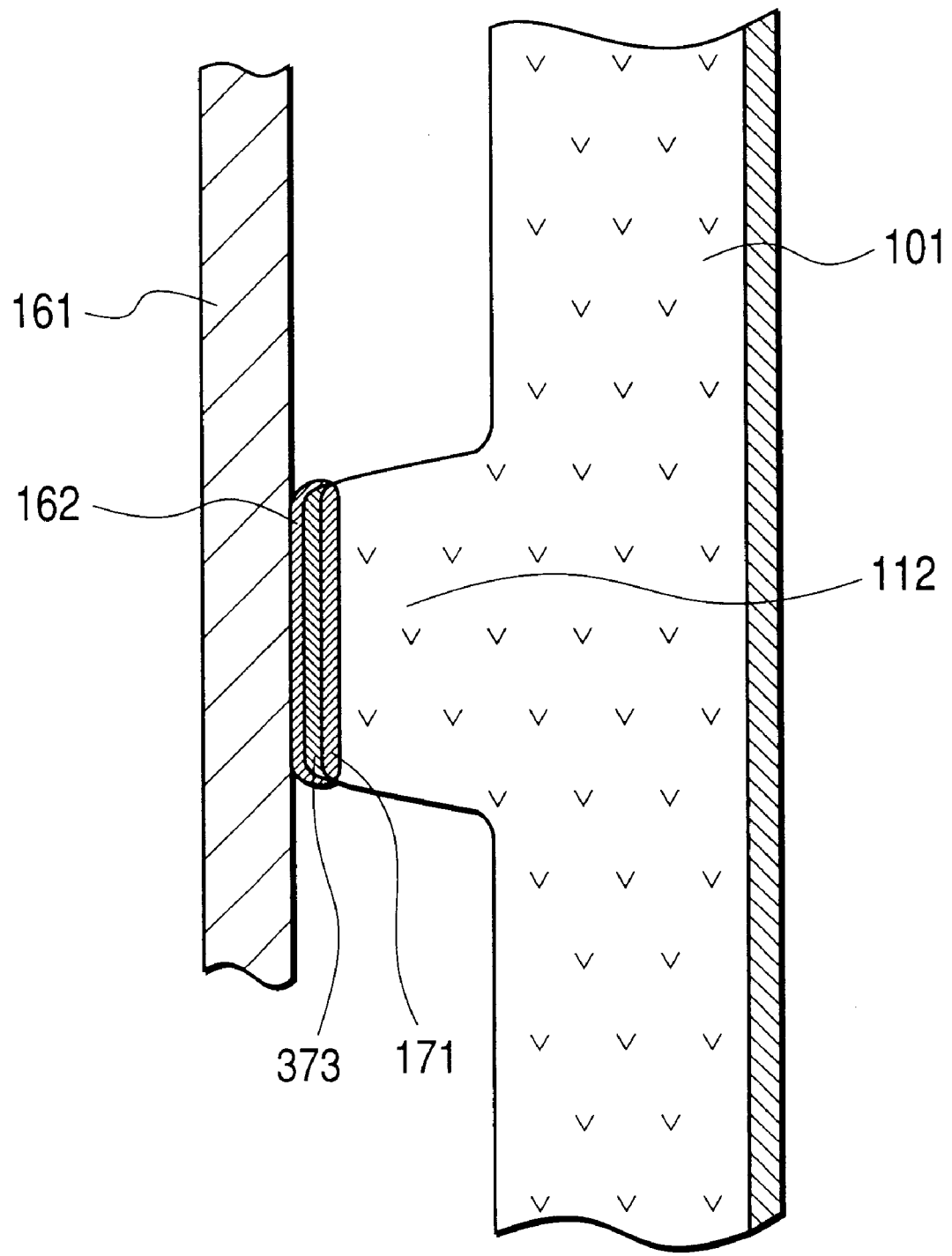
FIG. 6 is a sectional view illustrating the vacuum switch of Example 3 with its essential part shown broken.

FIG. 6 diagrammatically illustrates an important part of the switch 100". Specifically, the ridge part 112 of the insulating valve 101 has a metallic layer 171 formed on the top thereof by low-temperature metallization in the same manner as in Example 1. This metallic layer 171 is coated with an alloy layer 373. This alloy layer 373 has been bonded to the arc shield 161 by brazing with the brazing material 162.

Thus, the insulating valve 101 equipped with the arc shield 161 (and hence the high-load switch 100") can be produced at low cost, and high dimensional accuracy and high bonding strength can be realized.

EXAMPLE 4

Example 4 will be described hereinafter. However, the description of the same points as in Example 3 will be omitted.

The present example describes application of a bonded object comprising a ceramic member for bonding and a metallic member to a vacuum switch as in Example 3. However, this vacuum switch differs from that of Example 3 in the structures of the arc shield and the insulating valve.

Figure 7:
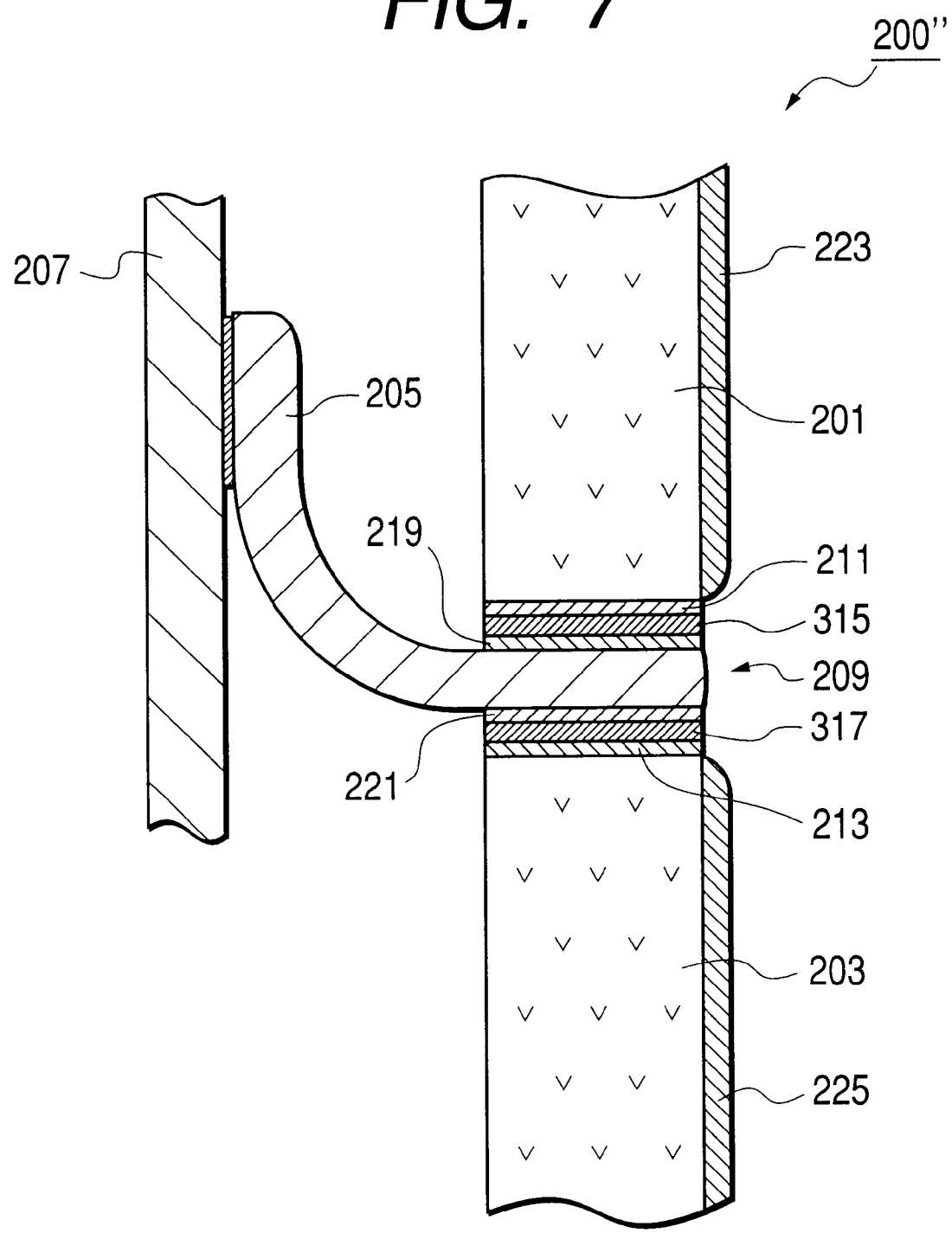
FIG. 7 is a sectional view illustrating the vacuum switch of Example 4 with its essential part shown broken.

An important part of the vacuum switch is diagrammatically shown in FIG. 7. This vacuum switch (high-load switch) 200" has a connecting member 205 made of oxygen-free copper interposed by brazing between an upper insulating valve 201 and a lower insulating valve 203, and further has an arc shield 207 bonded by brazing to the front end of the connecting member 205.

In particular, in the part (fixing part 209) where the upper insulating valve 201 and lower insulating valve 203 are fixed to the connecting member 205, the upper and lower insulating valves 201 and 203 respectively have metallic layers 211 and 213 formed thereon by metallization in the same manner as in Example 1. These metallic layers 211 and 213 are coated with alloy layers 315 and 317.

These alloy layers 315 and 317 have been bonded to the connecting member 205 with brazing materials 219 and 221, respectively. Thus, the two insulating valves 201 and 203 have been united with the connecting member 205.

The two insulating valves 201 and 203 have, on the outer circumferential surfaces thereof, glaze layers 223 and 225, respectively, which are the same as the glaze layer in Example 3.

The present example brings about the same effects as Example 3.

The invention should not be construed as being limited to the Examples give above in any way. It is a matter of course that the invention can be practiced in various modes unless these modes depart from the spirit of the invention.

For example, while Examples 1 and 2 have been described with reference to the case where a metallic layer which is a lower layer and an alloy layer which is an upper layer are bonded directly to each other, an interlayer having a constitution different from these layers (e.g., nickel-molybdenum alloy layer) may be formed interposed therebetween.

Comparative Example 1

Figure 8:
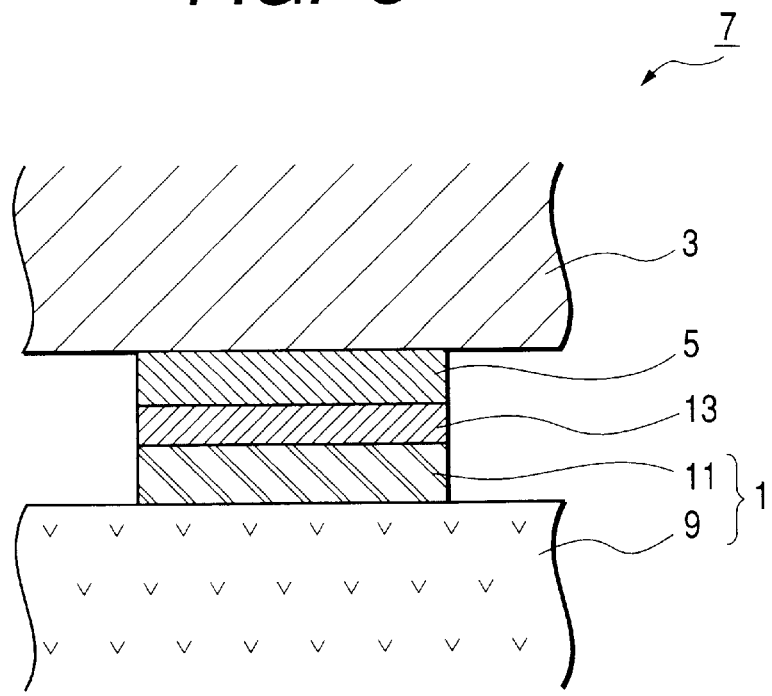
FIG. 8 is a sectional view illustrating an important part of a bonded object shown in Comparative Example 1.

A bonded object comprising a ceramic member for bonding and a metallic member is described as an embodiment.

a) FIG. 8 diagrammatically shows this embodiment, which is a bonded object 7 comprising a ceramic member for bonding 1 and a metallic member 3 bonded thereto with a brazing material 5.

More specifically, the ceramic member for bonding 1 comprises a ceramic base 9 and a metallic layer 11 formed thereon by metallization. A deposit layer (plating layer) 13 has been formed by plating on the metallic layer 11. The deposit layer 13 and the metallic member 3 have been bonded to each other with the brazing material 5, whereby the ceramic member for bonding 1 and the metallic member 3 have been united with each other.

b) A process for producing a ring-shaped test piece as an example of this bonded object will be explained below together with a process for producing a ceramic member for bonding.

(1) First, particulate metallizing-ink ingredients shown in Table 2-1 which will be given later were pulverized and mixed together, and this powder mixture (e.g., 87% by weight) was mixed with an organic binder (e.g., 13% by weight) such as, e.g., ethyl cellulose to obtain a paste. Thus, a metallizing ink was produced.

(2) The metallizing ink thus produced was applied to a surface of an alumina-based ceramic base 9 (e.g., 92% by weight alumina) which was a sintered ceramic (e.g., a ring-shaped test piece having a thickness of 5 mm, an outer diameter of 30 mm, and an inner diameter of 8.5 mm) in a thickness of about from 10 to 20 μm.

(3) Subsequently, the ceramic base 9 coated with the metallizing ink was placed in a furnace and sintered (metallized) at the temperatures of from 1,150 to 1,350° C. shown in Table 2-2 below in an atmosphere of $H_2/N_2$ (1:1) forming gas having a wetter temperature of 50° C. Thus, a ceramic member for bonding 1 was obtained which consisted of the ceramic base 9 and a metallic layer 11 formed thereon by metallization.

(4) The surface of the metallic layer 11 (metallized side) was electroplated with nickel to form a deposit layer 13. This deposit layer 13 was sintered (sintered) in an H$_2$ atmosphere at a temperature of 830° C.

(5) Thereafter, the ceramic member for bonding 1 and a metallic member 3 made of Kovar (Fe—Ni—Co) were brazed together.

Specifically, a foil of a silver brazing material (BAg-8) 5 was interposed between the deposit layer 13 and the metallic member 3 (e.g., a Kovar disk having a thickness of 1 mm and an outer diameter of 16 mm). This assemblage was heated at a given brazing temperature and then cooled to braze the ceramic member for bonding 1 and the metallic member 3 together. Thus, a bonded object 7 was completed.

Figure 9:
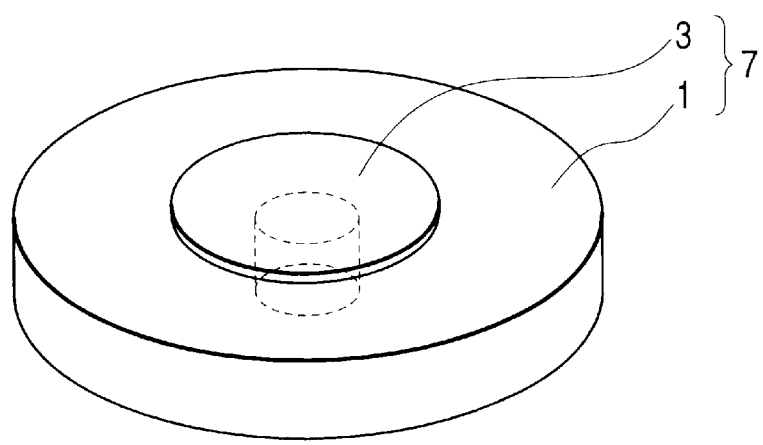
FIG. 9 is a slant view illustrating a bonded object obtained in Comparative Example 1.

Using the metallizing inks having different compositions as shown in Table 2-1 below, ring-shaped test pieces (samples) Nos. 2-2 to 2-17 as shown in FIG. 9 were produced, as bonded objects 7 to be tested, through the steps (1) to (5) described above. Sample No. 2-1 as a comparative example was further produced using a metallizing ink having a different composition (not containing nickel).

TABLE 2-1

| Sample | Content in metallizing ink [wt %] | | | | | | Remarks |
|---|---|---|---|---|---|---|---|
| No. | Mo | Ni | Mn | Ti | SiO$_2$ | Total | |
| 2-1 | 91.5 | 0.0 | 7.3 | 1.2 | 0.0 | 100.0 | comparative example |
| 2-2 | 81.0 | 0.5 | 7.3 | 1.2 | 10.0 | 100.0 | comparative example |
| 2-3 | 80.5 | 1.0 | 7.3 | 1.2 | 10.0 | 100.0 | comparative example |
| 2-4 | 76.5 | 5.0 | 7.3 | 1.2 | 10.0 | 100.0 | comparative example |
| 2-5 | 71.5 | 10.0 | 7.3 | 1.2 | 10.0 | 100.0 | comparative example |
| 2-6 | 68.5 | 13.0 | 7.3 | 1.2 | 10.0 | 100.0 | comparative example |
| 2-7 | 85.5 | 5.0 | 7.3 | 1.2 | 1.0 | 100.0 | comparative example |
| 2-8 | 71.5 | 5.0 | 7.3 | 1.2 | 15.0 | 100.0 | comparative example |
| 2-9 | 66.9 | 5.0 | 7.3 | 1.2 | 20.0 | 100.0 | comparative example |
| 2-10 | 76.5:W | 5.0 | 7.3 | 1.2 | 10.0 | 100.0 | comparative example |
| 2-11 | 81.3 | 5.0 | 2.5 | 1.2 | 10.0 | 100.0 | comparative example |
| 2-12 | 68.8 | 5.0 | 15.0 | 1.2 | 10.0 | 100.0 | comparative example |
| 2-13 | 77.5 | 5.0 | 7.3 | 0.2 | 10.0 | 100.0 | comparative example |
| 2-14 | 84.7 | 5.0 | 7.3 | 3.0 | 10.0 | 100.0 | comparative example |
| 2-15 | 97.0 | 3.0 | 0.0 | 0.0 | 0.0 | 100.0 | comparative example |
| 2-16 | 83.5 | 5.0 | 7.3 | 1.2 | 3.0 | 100.0 | comparative example |
| 2-17 | 82.5 | 5.0 | 1.0 | 1.2 | 10.0 | 100.0 | comparative example |

Furthermore, during the production process described above, the metallic layer 11 of each ceramic member for bonding 1 produced was quantitatively analyzed to determine the contents of components. This quantitative analysis was made with an electron probe microanalyzer (accelerating voltage, 20 kV; spot diameter, 5 μm). The results obtained are shown in Table 2-2 below.

With respect to each sample, the analysis was made on five points so as to reduce influences of segregation and the five found values obtained for each component were averaged. In Table 2-2, the contents of silicon, aluminum, calcium, and magnesium are given in terms of oxide amount.

TABLE 2-2

| Sample | Found value after sintering (average) [wt %] | | | | | | | | |
|---|---|---|---|---|---|---|---|---|---|
| No. | Mo | Ni | Mn | Ti | SiO$_2$ | Al$_2$O$_3$ | CaO | MgO | Total |
| 2-1 | 77.8 | 0.0 | 2.4 | 0.6 | 11.3 | 6.5 | 1.0 | 0.4 | 100.0 |
| 2-2 | 75.7 | 0.4 | 2.6 | 0.7 | 12.3 | 6.8 | 1.0 | 0.5 | 100.0 |
| 2-3 | 75.4 | 0.6 | 2.7 | 0.7 | 12.2 | 6.8 | 1.1 | 0.5 | 100.0 |
| 2-4 | 78.6 | 2.2 | 2.6 | 0.7 | 9.1 | 5.7 | 1.1 | 0.0 | 100.0 |
| 2-5 | 70.0 | 7.6 | 2.0 | 1.4 | 11.2 | 6.5 | 1.1 | 0.2 | 100.0 |
| 2-6 | 69.1 | 9.8 | 1.9 | 1.3 | 10.5 | 6.2 | 1.0 | 0.2 | 100.0 |
| 2-7 | 79.4 | 2.3 | 2.7 | 0.7 | 8.4 | 5.4 | 0.9 | 0.2 | 100.0 |
| 2-8 | 72.0 | 2.2 | 1.7 | 0.5 | 16.3 | 6.2 | 1.0 | 0.1 | 100.0 |
| 2-9 | 67.5 | 2.0 | 1.6 | 0.4 | 21.0 | 6.4 | 1.0 | 0.0 | 100.0 |
| 2-10 | 78.8 | 2.1 | 2.5 | 0.7 | 9.0 | 5.8 | 1.1 | 0.0 | 100.0 |
| 2-11 | 77.9 | 2.2 | 1.4 | 0.7 | 10.8 | 5.9 | 1.0 | 0.1 | 100.0 |
| 2-12 | 75.3 | 2.3 | 3.0 | 0.7 | 11.2 | 6.2 | 1.1 | 0.2 | 100.0 |
| 2-13 | 76.2 | 2.1 | 2.5 | 0.1 | 11.5 | 6.4 | 1.1 | 0.1 | 100.0 |
| 2-14 | 75.6 | 2.8 | 2.6 | 2.1 | 10.2 | 5.7 | 1.0 | 0.0 | 100.0 |
| 2-15 | 84.5 | 2.6 | 0.0 | 0.3 | 6.8 | 5.0 | 0.7 | 0.1 | 100.0 |
| 2-16 | 78.4 | 2.4 | 2.8 | 0.6 | 8.8 | 5.8 | 1.0 | 0.2 | 100.0 |
| 2-17 | 78.2 | 2.3 | 0.5 | 0.6 | 11.1 | 6.1 | 1.0 | 0.2 | 100.0 |

In producing sample No. 2-10, tungsten was used in place of molybdenum.

c) The bonded object samples produced by the process described above were examined for bonding strength.

Figure 10:
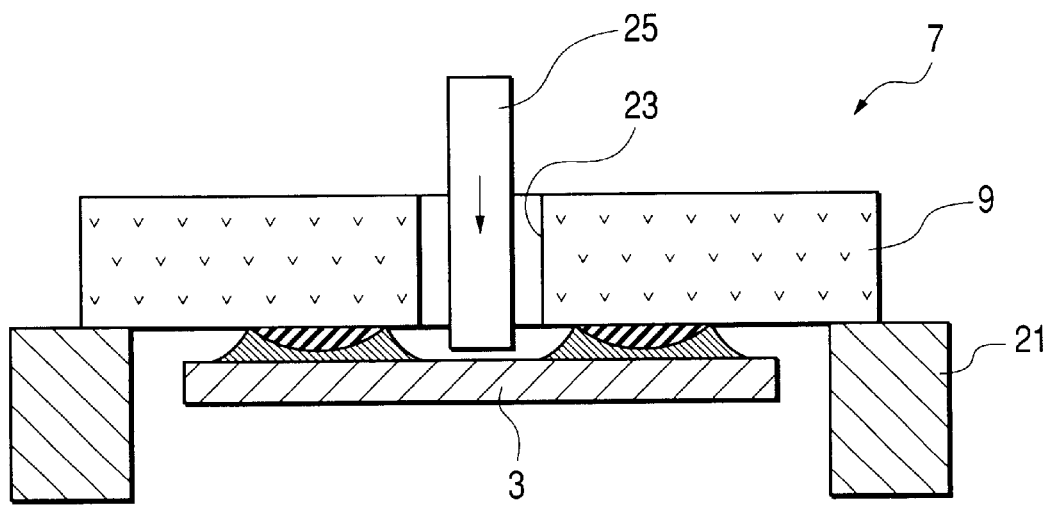
FIG. 10 is a view illustrating a method of measuring the bonding strength of the bonded object obtained in Comparative Example 1.

This examination was conducted in the following manner. As shown in FIG. 10, each bonded object 7 was placed so that the metallic member 3 faced downward and that the lower side of a peripheral part of the ceramic base 9 was supported on a cylindrical iron pedestal 21. A cylindrical punching rod 25 made of stainless steel was inserted from the upper side into the central through-hole 23 of the ceramic base 9 held in that state. The punching rod 25 was then moved downward at a rate of 0.5 mm/min.

The strength (breaking strength) at the time when the metallic member 3 separated from the ceramic base 9 was measured with a load cell (not shown) disposed over the punching rod 25. This strength was taken as brazing strength. With respect to each sample, the brazing strengths for the respective sintering temperatures are shown in the following Table 2-3.

TABLE 2-3

| Sample | Brazing strength [MPa] | | | | | Evaluation |
|---|---|---|---|---|---|---|
| No. | 1150° C. | 1200° C. | 1250° C. | 1300° C. | 1350° C. | |
| 2-1 | 4.9 | 8.0 | 9.7 | 16.7 | 18.6 | X |
| 2-2 | 6.9 | 12.7 | 11.8 | 6.9 | 4.9 | Δ |
| 2-3 | 11.8 | 17.6 | 14.7 | 7.8 | 3.9 | ◯ |
| 2-4 | 17.6 | 19.6 | 15.7 | 6.9 | 3.9 | ◯ |
| 2-5 | 17.6 | 18.6 | 14.7 | 6.9 | 2.9 | ◯ |
| 2-6 | 12.7 | 12.7 | 10.8 | 5.9 | 2.9 | Δ |
| 2-7 | 9.8 | 15.4 | 13.3 | 4.9 | 3.9 | Δ |
| 2-8 | 14.7 | 17.6 | 15.7 | 6.9 | 3.9 | ◯ |
| 2-9 | 10.8 | 14.7 | 11.8 | 3.9 | 2.9 | Δ |
| 2-10 | 16.9 | 19.1 | 16.0 | 5.9 | 2.9 | ◯ |
| 2-11 | 15.3 | 14.1 | 10.9 | 5.9 | 3.9 | Δ |
| 2-12 | 12.8 | 14.0 | 11.0 | 6.9 | 3.9 | Δ |
| 2-13 | 13.7 | 15.6 | 11.8 | 5.7 | 4.2 | Δ |
| 2-14 | 15.2 | 14.5 | 10.2 | 6.0 | 4.3 | Δ |
| 2-15 | 10.3 | 14.6 | 15.7 | 6.9 | 3.9 | Δ |
| 2-16 | 12.8 | 17.2 | 15.6 | 5.9 | 3.9 | ◯ |
| 2-17 | 14.5 | 13.6 | 10.1 | 5.7 | 2.9 | Δ |

In the column "Evaluation" in Table 2-3, ◯ indicates that the sample had a peak not lower than 17 MPa in the range of from 1,150 to 1,250° C., Δ indicates that the sample had a peak of from 10 to 17 MPa in that temperature range, and X indicates that the sample had no peak of 10 MPa or higher in that temperature range.

Comparative Example 2

In Comparative Example 2, explanations on the same points as in Comparative Example 1 are omitted.

Figure 11:
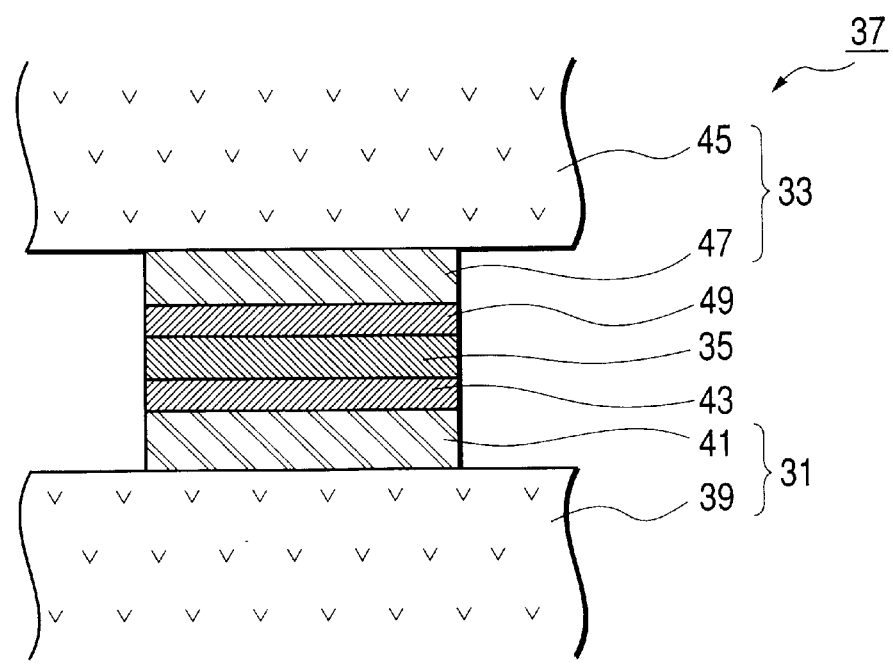
FIG. 11 is a sectional view illustrating an important part of a bonded object shown in Comparative Example 2.

In this Comparative Example, a bonded object comprising two ceramic members bonded to each other is described as an embodiment.

a) FIG. 11 diagrammatically shows this embodiment, which is a bonded object 37 comprising a first ceramic member for bonding 31 made of alumina and, bonded thereto with a brazing material 35, a second ceramic member for bonding 33 made of alumina and similar to the first ceramic member 31.

More specifically, the first ceramic member for bonding 31 comprises a first ceramic base 39 and a first metallic layer 41 formed thereon by metallization. A first deposit layer 43 has been formed on this first metallic layer 41 by nickel plating. On the other hand, the second ceramic member for bonding 33 comprises a second ceramic base 45 and a second metallic layer 47 formed thereon by metallization. A second deposit layer 49 has been formed on this second metallic layer 47 by nickel plating. The first ceramic member for bonding 31 and the second ceramic member for bonding 33 have been united with each other by bonding the first deposit layer 43 to the second deposit layer 49 with the brazing material 35.

b) A process for producing a ring-shaped test piece as an example of this bonded object will be explained below together with a process for producing ceramic members for bonding.

(1) Using particulate metallizing-ink ingredients shown in Table 2-1 given above, metallizing inks for respective samples were produced in the same manner as in Comparative Example 1 (hereinafter, the points on which explanation is omitted here are the same as in Comparative Example 1).

(2) Each of the metallizing inks thus produced was applied to a surface of a first ceramic base 39 and to a surface of a second ceramic base 45.

(3) Subsequently, the first and second ceramic bases 39 and 45 coated with the metallizing ink were placed in a furnace and sintered at temperatures in the range of from 1,150 to 1, 350° C. to obtain first and second ceramic members for bonding 31 and 33.

(4) The surfaces of the first and second metallic layers 41 and 47 thus formed by metallization were nickel-plated to form first and second deposit layers 43 and 49.

(5) Thereafter, a silver brazing material 35 was interposed between the two deposit layers 43 and 49 to braze the ceramic members for bonding 31 and 33 together. Thus, the ceramic members 31 and 33 were united with each other to complete a bonded object 37.

c) The bonded object samples (test pieces of sample Nos. 2-1 to 2-17) produced by the process described above were examined for bonding strength by the same method as in Comparative Example 1.

The results obtained are shown in Table 2-4 below.

TABLE 2-3

| Sample No. | Brazing strength [MPa] | | | | | Evaluation |
|---|---|---|---|---|---|---|
| | 1150° C. | 1200° C. | 1250° C. | 1300° C. | 1350° C. | |
| 2-1 | 16.6 | 28.5 | 37.8 | 58.8 | 63.7 | X |
| 2-2 | 24.5 | 47.0 | 38.0 | 26.5 | 20.6 | Δ |

TABLE 2-3-continued

| Sample No. | Brazing strength [MPa] | | | | | Evaluation |
|---|---|---|---|---|---|---|
| | 1150° C. | 1200° C. | 1250° C. | 1300° C. | 1350° C. | |
| 2-3 | 47.0 | 63.7 | 60.8 | 32.3 | 14.7 | ○ |
| 2-4 | 60.8 | 66.6 | 63.7 | 27.4 | 15.7 | ○ |
| 2-5 | 62.7 | 63.0 | 60.8 | 26.5 | 9.8 | ○ |
| 2-6 | 46.8 | 44.0 | 34.1 | 22.5 | 11.8 | Δ |
| 2-7 | 32.3 | 52.2 | 46.1 | 20.6 | 15.7 | Δ |
| 2-8 | 56.8 | 62.7 | 62.7 | 27.4 | 14.7 | ○ |
| 2-9 | 41.1 | 44.7 | 35.1 | 16.7 | 10.8 | Δ |
| 2-10 | 58.9 | 64.3 | 63.5 | 25.1 | 13.3 | ○ |
| 2-11 | 59.4 | 59.6 | 45.3 | 23.8 | 11.2 | Δ |
| 2-12 | 44.3 | 48.7 | 40.2 | 26.2 | 10.4 | Δ |
| 2-13 | 58.8 | 58.6 | 48.4 | 28.4 | 8.4 | Δ |
| 2-14 | 58.2 | 56.1 | 51.2 | 21.4 | 10.1 | Δ |
| 2-15 | 40.1 | 48.7 | 53.8 | 26.2 | 10.2 | Δ |
| 2-16 | 51.2 | 62.4 | 58.4 | 27.8 | 11.3 | ○ |
| 2-17 | 56.3 | 54.1 | 49.6 | 21.8 | 9.7 | Δ |

In the column "Evaluation" in Table 2-4, ○ indicates that the sample had a peak not lower than 60 MPa in the range of from 1,150 to 1,250° C., Δ indicates that the sample had a peak of from 40 to 60 MPa in that temperature range, and X indicates that the sample had no peak of 40 MPa or higher in that temperature range.

Comparative Example 3

In Comparative Example 3, explanations on the same points as in Comparative Examples 1 and 2 are omitted.

This Comparative Example describes application of a bonded object comprising a ceramic member for bonding and a metallic member, such as that shown in Comparative Example 1, to a vacuum switch as an embodiment.

This vacuum switch is a high-load switch which comprises a vacuum vessel having built-in electrodes and other components and is suitable for the switching of high-voltage large-current electricity.

Figure 12:
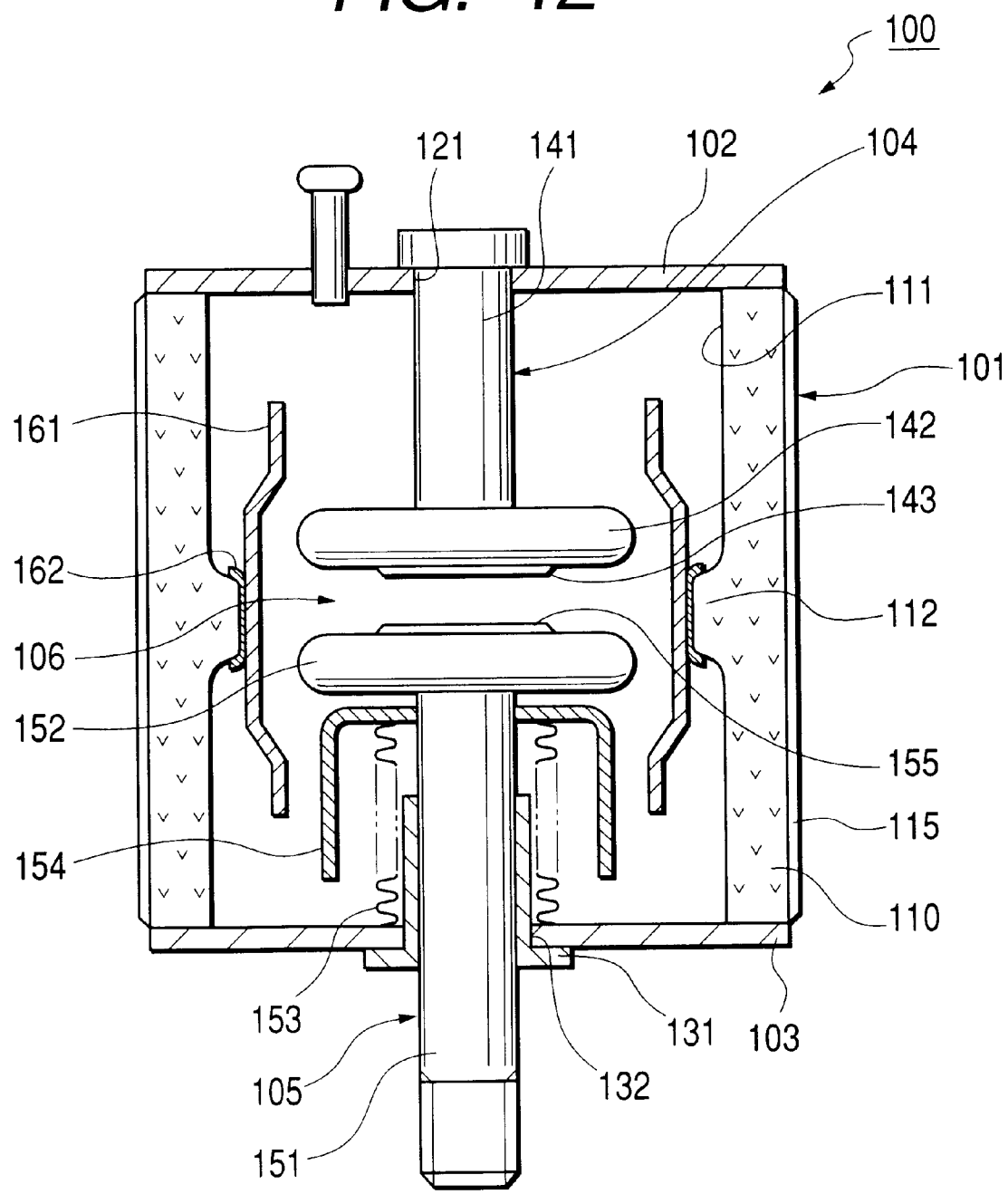
FIG. 12 is a partially cutaway view illustrating the vacuum switch shown in Comparative Example 3.

The vacuum switch is explained by FIG. 12 in the same manner as the above-described explanations by FIG. 5 in EXAMPLE 3 except that the reference sign 100" is replaced with 100.

Namely, like the bonded object of Comparative Example 1, the high-load switch 100 of this Comparative Example comprises the insulating valve 101, which is a ceramic member for bonding, and the arc shield 161, which is a metallic member, bonded by brazing with a brazing material 162 to the ridge part 112 of the insulating valve 101.

Figure 13:
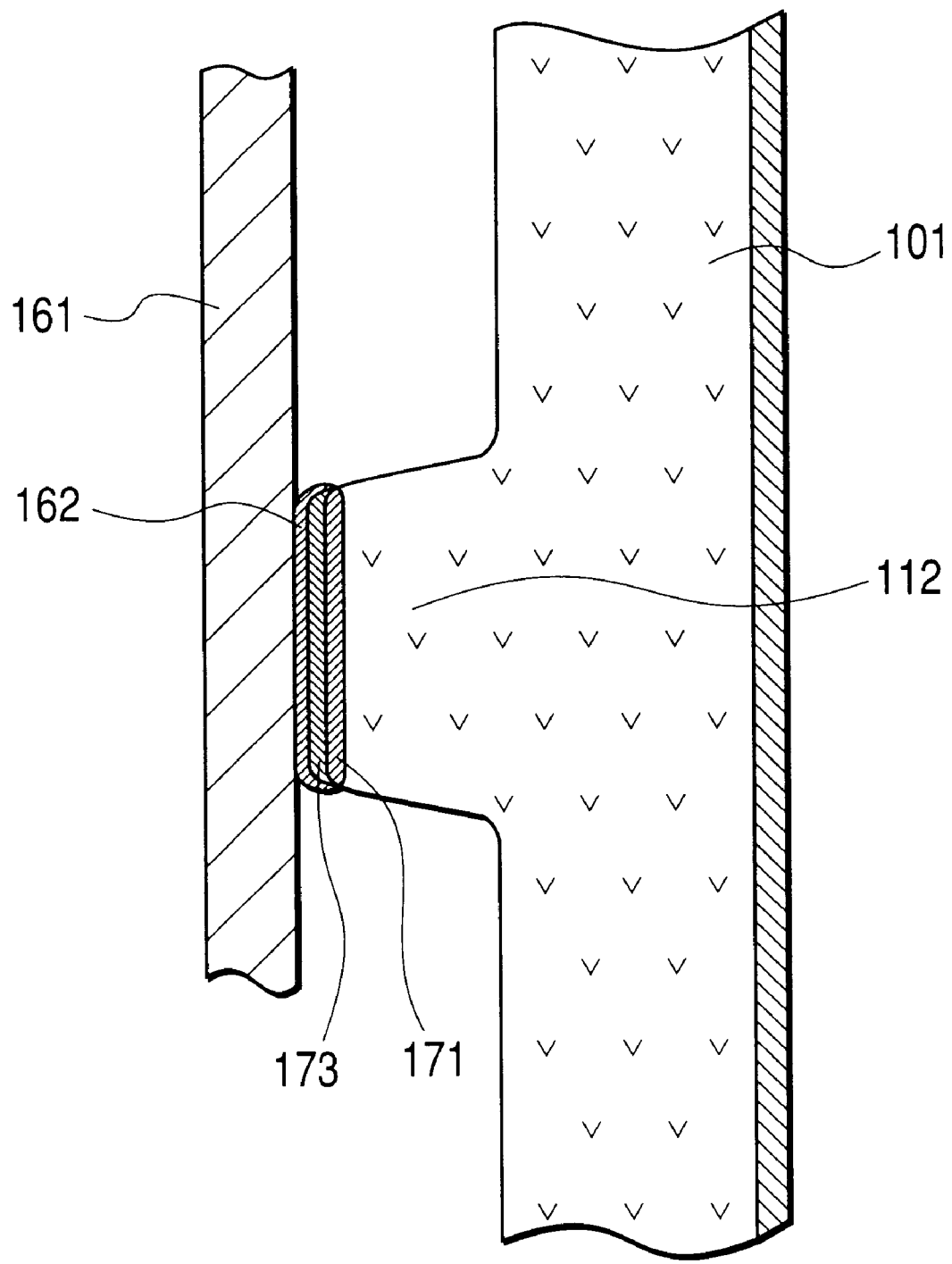
FIG. 13 is a sectional view illustrating an important part of the vacuum switch shown in Comparative Example 3.

FIG. 13 diagrammatically illustrates an important part of the switch 100. Specifically, the ridge part 112 of the insulating valve 101 has a metallic layer 171 formed on the top thereof by low-temperature metallization in the same manner as in Comparative Example 1. This metallic layer 171 is coated with a deposit layer 173 formed by nickel plating. This deposit layer 173 has been bonded to the arc shield 161 by brazing with the brazing material 162.

Comparative Example 4

In Comparative Example 4, explanations on the same points as in Comparative Example 3 are omitted.

This Comparative Example describes application of a bonded object comprising a ceramic member for bonding and a metallic member to a vacuum switch as in Comparative Example 3. However, this vacuum switch differs from that of Comparative Example 3 in the structures of the arc shield and the insulating valve.

Figure 14:
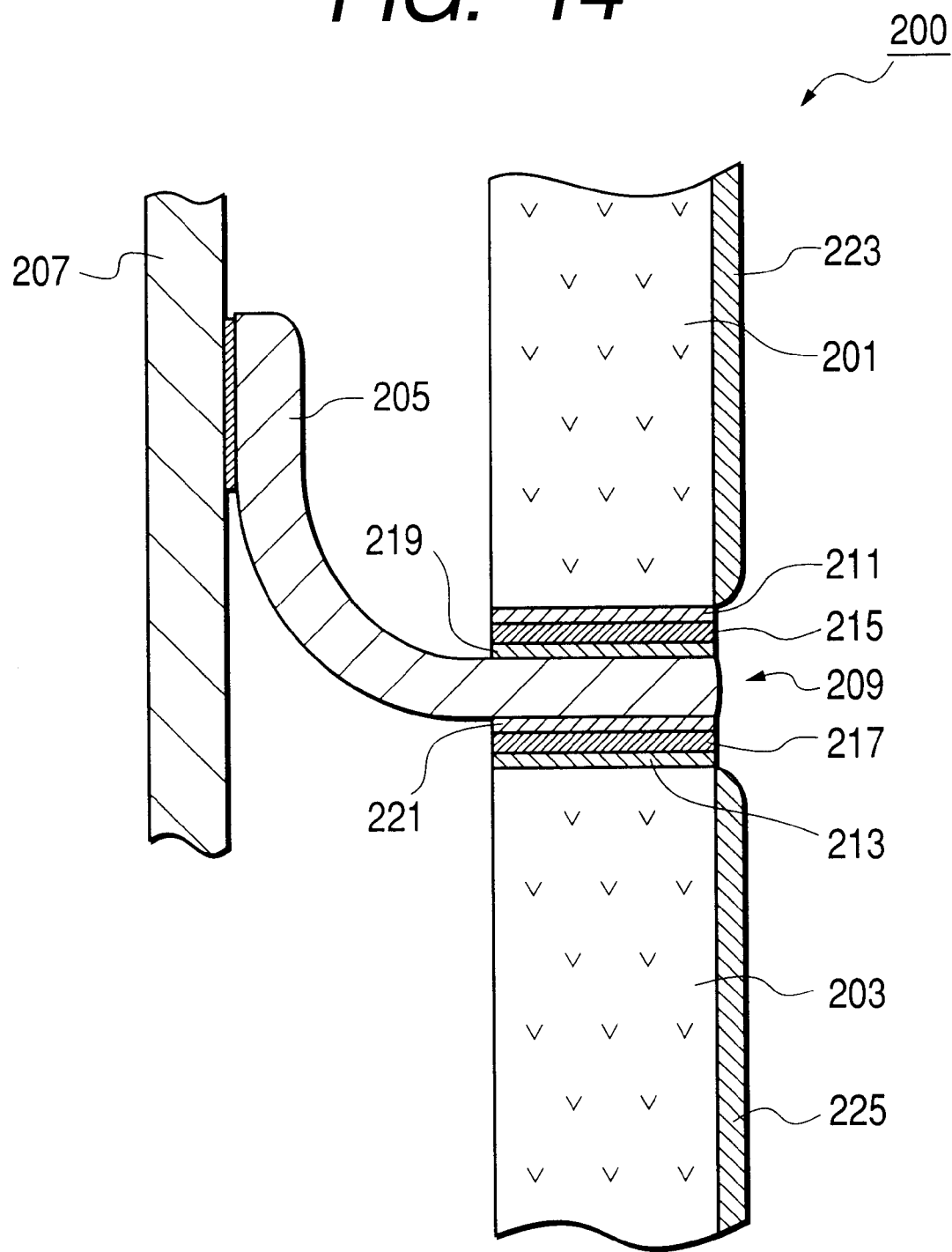
FIG. 14 is a sectional view illustrating an important part of the vacuum switch shown in Comparative Example 4.

The vacuum switch is explained by FIG. 14 in the same manner as the above-described explanations by FIG. 7 in EXAMPLE 4 except that the reference sign 200", 315 and 317 are replaced with 200, 215 and 217, respectively.

The two insulating valves 201 and 203 have, on the outer circumferential surfaces thereof, glaze layers 223 and 225, respectively, which are the same as the glaze layer in Comparative Example 3.

This Comparative Example brings about the same effects as Comparative Example 3.

Comparative Example 5

A bonded object comprising a ceramic member for bonding and a metallic member is described as a comparative example.

Figure 15:
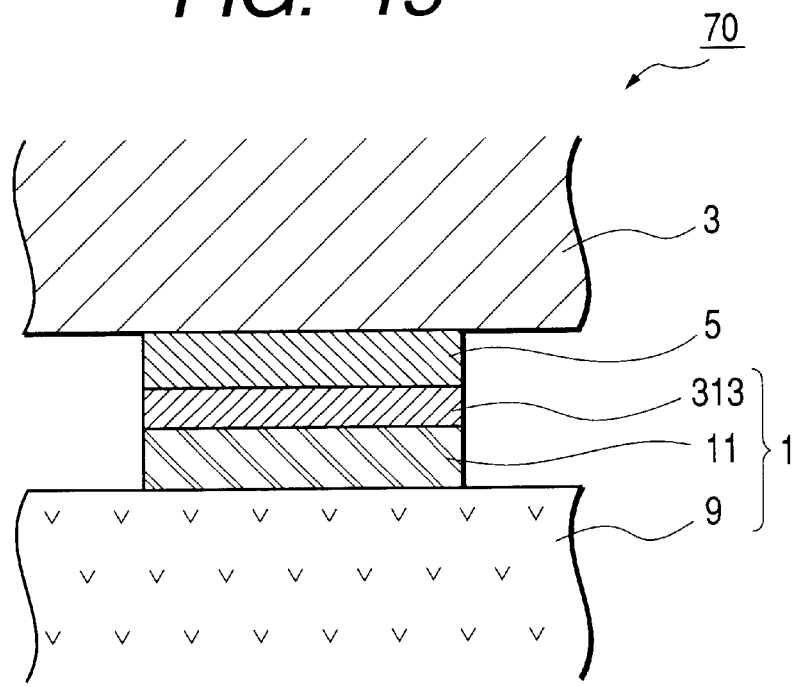
FIG. 15 is a sectional view illustrating an important part of a bonded object shown in Comparative Example 5.

The bonded object is explained by FIG. 15 in the same manner as the above-described explanations by FIG. 8 in COMPARATIVE EXAMPLE 1 except that the reference sign 7 and 13 are replaced with 70 and 313, respectively.

In particular, in this comparative example, the layer formed by metallization 11 comprises from 71 to 88% by weight molybdenum, from 0.7 to 5.5% by weight nickel, and from 3 to 18% by weight $SiO_2$ in terms of silicon oxide amount, while the alloy layer 313 comprises from 36 to 61.3% by weight nickel and from 33 to 60% by weight copper (or from 2 to 30% by weight manganese).

b) A process for producing a ring-shaped test piece as an example of this bonded object 70 will be explained below together with a process for producing a ceramic member for bonding 1.

(1) First, a first paste (first metallizing ink) was produced by preparing a first mixture consisting of molybdenum particles, nickel particles, and $SiO_2$ particles in a proportion shown in Table 2-5 below, pulverizing and mixing the first mixture of particles, and mixing the first mixture (e.g., 87% by weight) with an organic binder (e.g., 13% by weight) such as, e.g., Ethyl cellulose.

(2) A second paste (second metallizing ink) was produced in the same manner by preparing a second mixture consisting of two or more members selected from nickel particles, copper particles, manganese particles, molybdenum particles, nickel-copper alloy particles, and nickel-manganese alloy particles as shown in Table 2-5 below, pulverizing and mixing the second mixture of particles, and mixing the second mixture (e.g., 87% by weight) with an organic binder (e.g., 13% by weight) such as, e.g., Ethyl cellulose.

(3) The first paste was applied to an alumina-based ceramic base 9 (e.g., 92% by weight alumina) which was a sintered ceramic (e.g., a ring-shaped test piece having a thickness of 5 mm, an outer diameter of 30 mm, and an inner diameter of 8.5 mm) in a thickness of about from 10 to 20 μm. The coating layer was dried to form a first layer (which will become a metallic layer 11 through metallization).

(4) Subsequently, the second paste was applied to the whole surface of the first layer in a thickness of about from 10 to 20 μm, and the coating layer was dried to form a second layer (which will become an alloy layer 313).

(5) The ceramic base 9 thus coated with the first layer and the second layer was placed in a furnace and sintered at the temperatures of from 1,050 to 1,200° C. shown in Table 2-7 in an atmosphere of $H_2/N_2$ (1:1) forming gas having a wetter temperature of 50° C. Thus, a ceramic member for bonding 1 was obtained which consisted of the ceramic base 9, a metallic layer 11 formed thereon by metallization, and an alloy layer 313 formed thereon.

(6) Thereafter, the ceramic member for bonding 1 and a metallic member 3 made of Kovar (Fe—Ni—Co) were brazed together.

Specifically, a foil of a silver brazing material (BAg-8) 5 was interposed between the alloy layer 313 and the metallic member 3 (e.g., a Kovar disk having a thickness of 1 mm and an outer diameter of 16 mm). This assemblage was heated at a given brazing temperature and then cooled to braze the ceramic member for bonding 1 and the metallic member 3 together. Thus, a bonded object 70 was completed.

Figure 16:
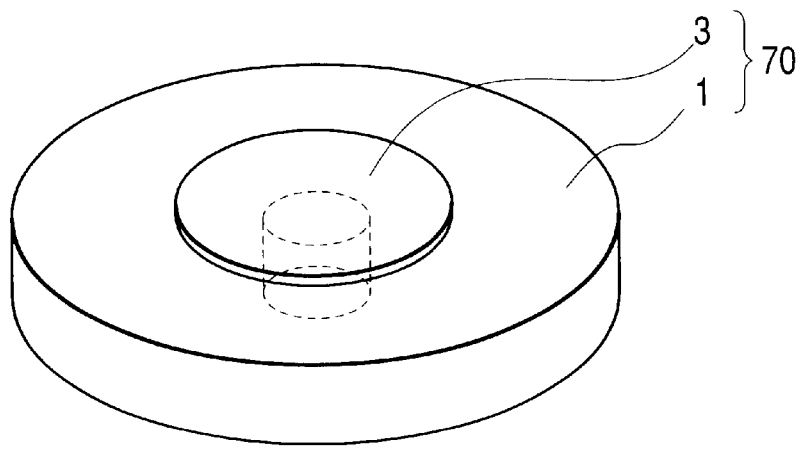
FIG. 16 is a slant view illustrating a bonded object obtained in Comparative Example 5.

Using the first and second pastes having different compositions as shown in Table 5 below, ring-shaped test pieces (samples) Nos. 2-101 to 2-110 and 2-115 to 2-120 as shown in FIG. 16 were produced, as bonded objects 70 to be tested, through the steps (1) to (6) described above.

Samples Nos.2-111 to 2-114 as comparative examples were further produced using pastes differing in those first and second pastes in composition.

TABLE 2-5

| Sample No. | First paste (for layer formed by metallization) | | | Second paste (for alloy layer) | | | |
|---|---|---|---|---|---|---|---|
| | Mo | Ni | $SiO_2$ | Ni | Cu | Mn | Mo |
| Comparative Example | 2-101 | 92 | 3 | 5 | 30 | 70 | — | — |
| | 2-102 | 92 | 3 | 5 | 40 | 60 | — | — |
| | 2-103 | 92 | 3 | 5 | 50 | 50 | — | — |
| | 2-104 | 92 | 3 | 5 | 70 | 30 | — | — |
| | 2-105 | 92 | 3 | 5 | 80 | 20 | — | — |
| | 2-106 | 92 | 3 | 5 | 30 | — | 70 | — |
| | 2-107 | 92 | 3 | 5 | 40 | — | 60 | — |
| | 2-108 | 92 | 3 | 5 | 50 | — | 50 | — |
| | 2-109 | 92 | 3 | 5 | 70 | — | 30 | — |
| | 2-110 | 92 | 3 | 5 | 80 | — | 20 | — |
| | 2-111 | 92 | 3 | 5 | 30 | — | — | 70 |
| | 2-112 | 92 | 3 | 5 | 50 | — | — | 50 |
| | 2-113 | 92 | 3 | 5 | 70 | — | — | 30 |
| | 2-114 | 92 | 3 | 5 | 100 | — | — | — |
| | 2-115 | 94.5 | 0.5 | 5 | 50 | 50 | — | — |
| | 2-116 | 94 | 1 | 5 | 50 | 50 | — | — |
| | 2-117 | 85 | 10 | 5 | 50 | 50 | — | — |
| | 2-118 | 98 | 1 | 1 | 50 | 50 | — | — |
| | 2-119 | 65 | 10 | 25 | 50 | 50 | — | — |
| | 2-120 | 70 | 10 | 20 | 50 | 50 | — | — |

Furthermore, a section of each ceramic member for bonding 1 produced was polished, and the layer formed by metallization 11 and the alloy layer 313 were quantitatively analyzed to determine the contents of components. This quantitative analysis was made with an electron probe microanalyzer (accelerating voltage, 20 kV; spot diameter, 5 μm). The results obtained are shown in Table 2-6 below.

With respect to each sample, the analysis was made on five points so as to reduce influences of segregation and the five found values for each component were averaged. In Table 2-6, the content of silicon is given in terms of oxide amount. In each layer, the remainder is accounted for by glass ingredients, such as $Al_2O_3$, MgO, and CaO, which have come into the layer from the ceramic base by diffusion.

Table 2-6

| | | Found value after sintering (average) [wt %] | | | | | | |
|---|---|---|---|---|---|---|---|---|
| | | Layer formed by metallization (lower layer) | | | Alloy layer (upper layer) | | | |
| Sample | No. | Mo | Ni | SiO$_2$ | Ni | Cu | Mn | Mo |
| Compara- | 2-101 | 91.3 | 0.5 | 4.7 | 29.2 | 68.3 | — | 1.0 |
| tive | 2-102 | 85.8 | 0.9 | 5.8 | 37.7 | 56.3 | — | 1.4 |
| Example | 2-103 | 90.9 | 2.2 | 3.1 | 45.1 | 46.2 | — | 3.8 |
| | 2-104 | 90.2 | 2.8 | 3.0 | 58.1 | 35.4 | — | 4.3 |
| | 2-105 | 89.7 | 3.2 | 4.2 | 61.4 | 30.5 | — | 5.1 |
| | 2-106 | 89.0 | 1.2 | 4.3 | 35.3 | — | 34.8 | 21.1 |
| | 2-107 | 89.4 | 1.3 | 4.0 | 43.3 | — | 26.1 | 18.5 |
| | 2-108 | 87.5 | 1.6 | 4.2 | 52.3 | — | 19.7 | 19.7 |
| | 2-109 | 88.0 | 1.5 | 4.6 | 61.1 | — | 2.5 | 30.5 |
| | 2-110 | 85.3 | 2.9 | 4.7 | 80.4 | — | 0.9 | 9.7 |
| | 2-111 | 87.4 | 2.7 | 4.8 | 25.3 | — | — | 67.8 |
| | 2-112 | 87.5 | 3.2 | 3.7 | 43.3 | — | — | 51.5 |
| | 2-113 | 87.0 | 4.0 | 3.9 | 60.8 | — | — | 33.5 |
| | 2-114 | 86.8 | 4.3 | 3.8 | 89.1 | — | — | 3.5 |
| | 2-115 | 88.8 | 0.7 | 4.8 | 46.2 | 47.3 | — | 4.0 |
| | 2-116 | 86.7 | 1.4 | 4.2 | 46.7 | 47.1 | — | 4.0 |
| | 2-117 | 84.7 | 5.3 | 3.2 | 47.2 | 47.0 | — | 3.7 |
| | 2-118 | 93.3 | 1.3 | 3.3 | 45.3 | 46.4 | — | 4.2 |
| | 2-119 | 70.1 | 4.1 | 19.2 | 44.8 | 46.8 | — | 2.8 |
| | 2-120 | 71.3 | 4.5 | 16.7 | 46.5 | 47.2 | — | 3.5 | c) The samples of the bonded object 70 produced by the process described above were examined for bonding strength.

Figure 17:
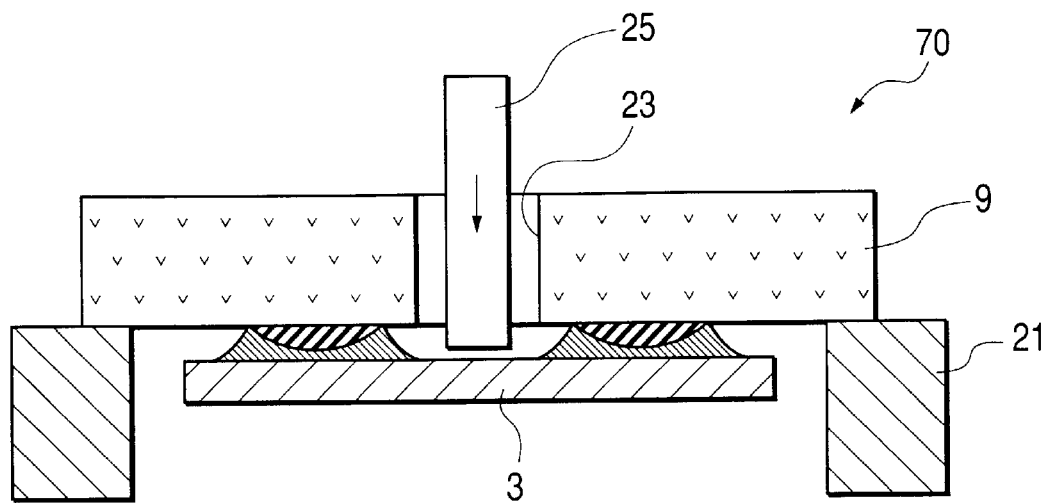
FIG. 17 is a view illustrating a method of measuring the bonding strength of the bonded object obtained in Comparative Example 5.

This examination was conducted in the same manner as in COMPARATIVE EXAMPLE 1 except that FIG. 10 is replaced with FIG. 17 and the reference sign 7 is replaced with 70 in the description. With respect to each sample, the evaluation of the brazing strengths (bonding strengths) for the respective sintering temperatures are shown in the following Table 2-7.

In the column "Evaluation of bonding strength and obtained data" in Table 2-7, ○ indicates that the sample had a bonding strength higher than 17 MPa in the range of from 1,050 to 1, 200° C., Δ indicates that the sample had a bonding strength of from 11 to 17 MPa in that temperature range, and X indicates that the sample had a bonding strength lower than 11 MPa in that temperature range. In addition, bonding strength data of each of the samples are shown in parentheses "( )" at the column "Evaluation of bonding strength and obtained data" in table 2-7.

TABLE 2-7

| | | Evaluation of bonding strength and obtained data [MPa] | | | |
|---|---|---|---|---|---|
| | | Sintering temperature [° C.] | | | |
| | | 1050 | 1100 | 1150 | 1200 |
| Compara- | 2-101 | X (2.0) | Δ (14.2) | ○ (17.3) | X (5.4) |
| tive | 2-102 | X (2.5) | ○k (19.8) | ○k (17.6) | X (5.8) |
| Example | 2-103 | X (5.7) | ○k (18.5) | ○k (19.3) | X (6.2) |
| | 2-104 | Δ (11.5) | ○k (17.8) | ○k (18.7) | X (6.0) |
| | 2-105 | X (6.0) | ○k (17.4) | Δ (16.4) | X (6.1) |
| | 2-106 | X (2.0) | ○ (17.2) | X (10.0) | X (5.3) |
| | 2-107 | X (1.8) | ○k (18.4) | ○ (18.4) | X (5.7) |
| | 2-108 | X (2.2) | ○k (19.0) | ○k (18.8) | X (5.5) |
| | 2-109 | X (3.1) | ○k (17.5) | ○k (18.1) | X (5.0) |
| | 2-110 | X (5.4) | ○ (17.1) | Δ (15.3) | X (4.7) |
| | 2-111 | X (1.9) | X (3.8) | Δ (11.3) | X (4.1) |
| | 2-112 | X (2.0) | X (6.0) | Δ (14.1) | Δ (11.2) |
| | 2-113 | X (2.2) | X (7.6) | Δ (12.8) | X (4.0) |
| | 2-114 | X (1.7) | X (8.4) | Δ (13.2) | X (4.2) |

TABLE 2-7-continued

| | | Evaluation of bonding strength and obtained data [MPa] | | | |
|---|---|---|---|---|---|
| | | Sintering temperature [° C.] | | | |
| | | 1050 | 1100 | 1150 | 1200 |
| | 2-115 | X (1.0) | Δ (15.5) | ○k (17.4) | Δ (12.8) |
| | 2-116 | X (1.2) | ○k (18.1) | ○k (18.4) | X (5.7) |
| | 2-117 | X (7.8) | ○k (17.5) | ○k (17.3) | X (6.0) |
| | 2-118 | X (2.1) | Δk (15.3) | ○k (17.2) | Δ (12.2) |
| | 2-119 | Δ (11.5) | ○k (17.7) | Δk (14.4) | X (5.7) |
| | 2-120 | Δ (13.5) | ○k (18.1) | ○k (17.3) | X (5.7) | d) Subsequently, the samples of the bonded object 70 produced by the process described above were examined for airtightness.

Specifically, one side of the bonded object 70 shown in FIG. 15 was made vacuum (1×10$^{-8}$ Torr or lower) and the other side was filled with helium to examine the bonded object 70 for helium leakage.

The results obtained are shown in Table 2-7 by means of symbol "k".

Comparative Example 6

In Comparative Example 6, explanations on the same points as in Comparative Example 5 are omitted.

Figure 18:
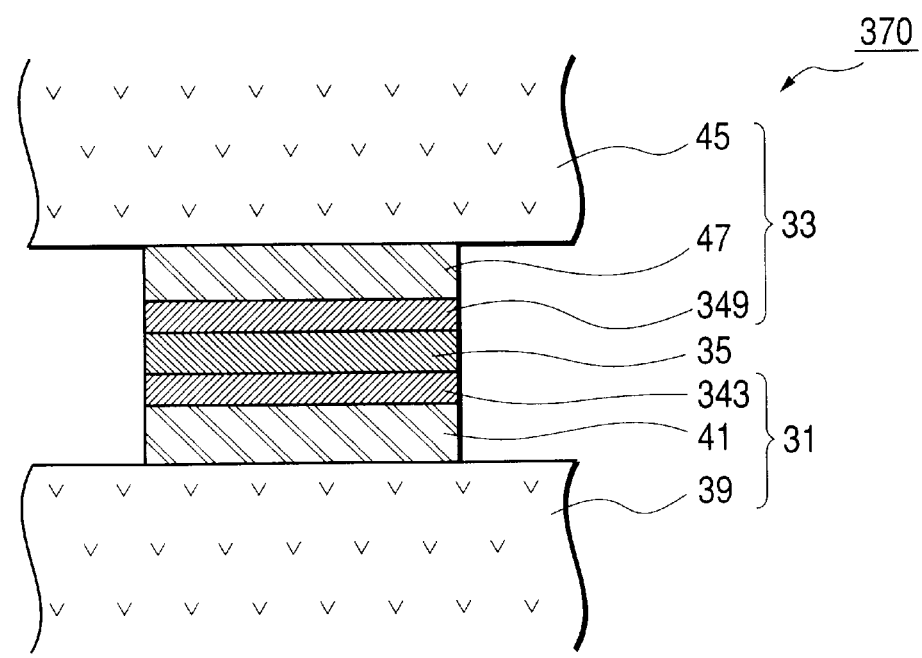
FIG. 18 is a sectional view illustrating an important part of a bonded object shown in Comparative Example 6.

In this Comparative Example, a bonded object comprising two ceramic members bonded to each other is described as an embodiment.

a) FIG. 18 diagrammatically shows this embodiment, which is a bonded object 370 comprising a first ceramic member for bonding 31 made of alumina and, bonded thereto with a brazing material 35, a second ceramic member for bonding 33 made of alumina and similar to the first ceramic member 31.

More specifically, the first ceramic member for bonding 31 comprises a first ceramic base 39, a first metallic layer 41 formed thereon by metallization, and a first alloy layer 343 formed on this first metallic layer 41. On the other hand, the second ceramic member for bonding 33 comprises a second ceramic base 45, a second metallic layer 47 formed thereon by metallization, and a second alloy layer 349 formed on this second metallic layer 47.

The first ceramic member for bonding 31 and the second ceramic member for bonding 33 have been united with each other by bonding the first alloy layer 343 to the second alloy layer 349 with the brazing material 35.

b) A process for producing this bonded object 370 will be explained below together with a process for producing the first and second ceramic members for bonding 31 and 33.

(1) Using particulate ingredients shown in Table 2-5 as first-paste and second-paste ingredients, a first paste and a second paste for each sample were produced in the same manner as in Comparative Example 5 (hereinafter, the points on which explanation is omitted here are the same as in Comparative Example 5).

(2) The first paste was applied to a surface of each of first and second ceramic bases 39 and 45 and then dried to form respective first layers.

(3) Subsequently, the second paste was applied to the surface of the first layer of each of the first and second ceramic bases 39 and 45 and then dried to form respective second layers.

(4) Thereafter, the first and second ceramic bases 39 and 45 each coated with the first layer and the second layer were placed in a furnace and sintered at temperatures in the range of from 1,050 to 1,200° C. Thus, a first ceramic member for bonding 31 having a first layer formed by metallization 41 and a first alloy layer 343 superposed thereon and a second ceramic member for bonding 33 having a second layer formed by metallization 47 and a second alloy layer 349 superposed thereon were obtained.

(5) Subsequently, a silver brazing material 35 was interposed between the two alloy layers 343 and 349 to braze the ceramic members for bonding 31 and 33 together. Thus, the ceramic members 31 and 33 were united with each other to complete a bonded object 370.

This bonded object 370 shown as an embodiment has high bonding strength and excellent air tightness like the bonded object shown in Comparative Example 5.

Comparative Example 7

In Comparative Example 7, explanations on the same points as in Comparative Examples 5 and 6 are omitted.

This Comparative Example describes application of a bonded object comprising a ceramic member for bonding and a metallic member, such as that shown in Comparative Example 5, to a vacuum switch as an embodiment.

This vacuum switch is a high-load switch which comprises a vacuum vessel having built-in electrodes and other components and is suitable for the switching of high-voltage large-current electricity.

Figure 19:
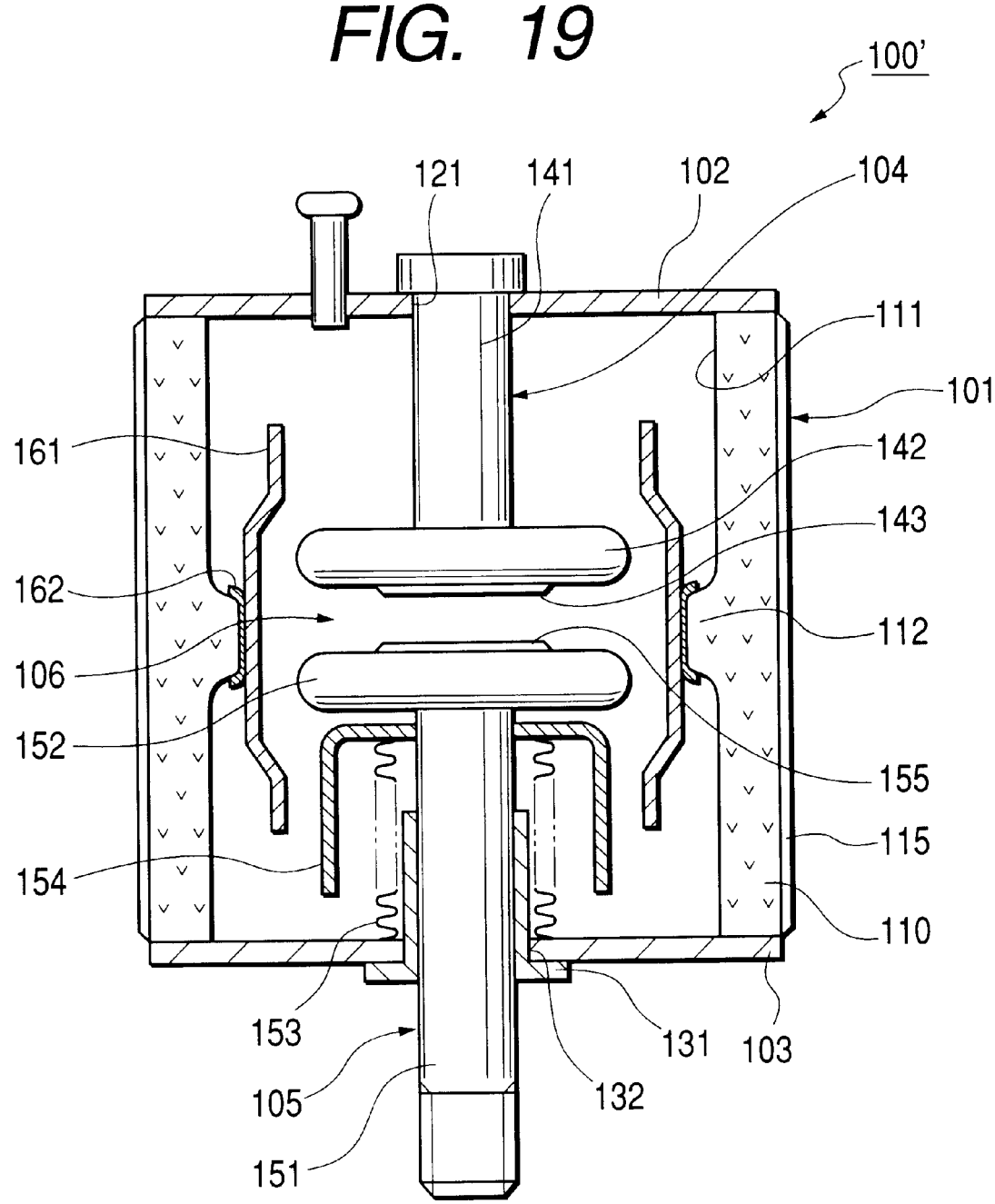
FIG. 19 is a partially cutaway view illustrating the vacuum switch shown in Comparative Example 7.

The vacuum switch is explained by FIG. 19 in the same manner as the above-described explanations by FIG. 5 in EXAMPLE 3 except that the reference sign 100" is replaced with 100'.

Namely, like the bonded object of Example 5, the high-load switch 100' of this Example comprises the insulating valve 101, which is a ceramic member for bonding, and the arc shield 161, which is a metallic member, bonded by brazing with a brazing material 162 to the ridge part 112 of the insulating valve 101.

Figure 20:
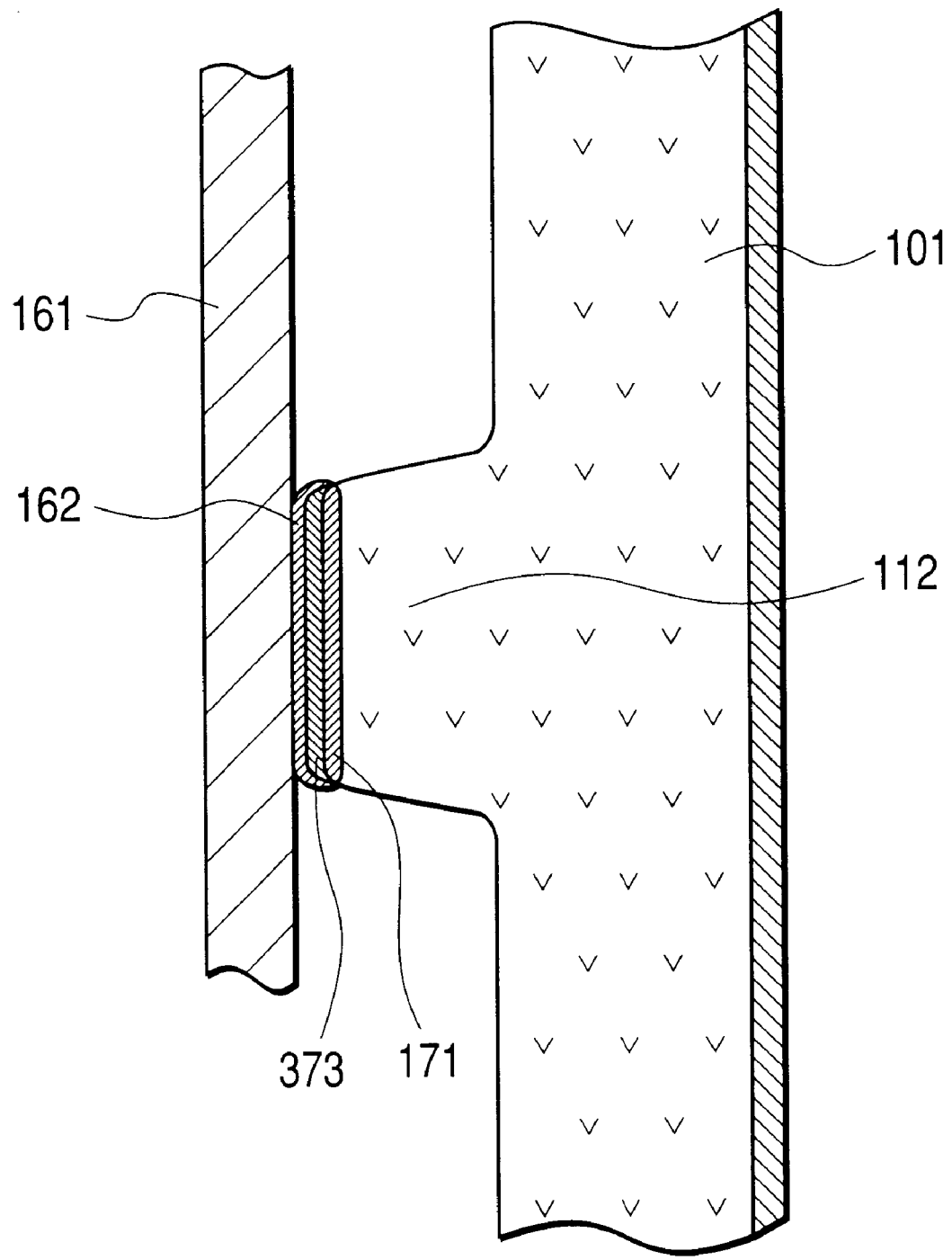
FIG. 20 is a sectional view illustrating an important part of the vacuum switch shown in Comparative Example 7.

FIG. 20 diagrammatically illustrates an important part of the switch 100'. Specifically, the ridge part 112 of the insulating valve 101 has a metallic layer 171 formed on the top thereof by low-temperature metallization in the same manner as in Comparative Example 5. This layer formed by metallization 171 is coated with an alloy layer 373. This alloy layer 373 has been bonded to the arc shield 161 by brazing with the brazing material 162.

Thus, the insulating valve 101 equipped with the arc shield 161 (and hence the high-load switch 100') can be produced at low cost, and high dimensional accuracy and high bonding strength can be realized.

Comparative Example 8

In Comparative Example 8, explanations on the same points as in Comparative Example 7 are omitted.

This Comparative Example describes application of a bonded object comprising a ceramic member for bonding and a metallic member to a vacuum switch as in Comparative Example 7. However, this vacuum switch differs from that of Comparative Example 7 in the structures of the arc shield and the insulating valve.

Figure 21:
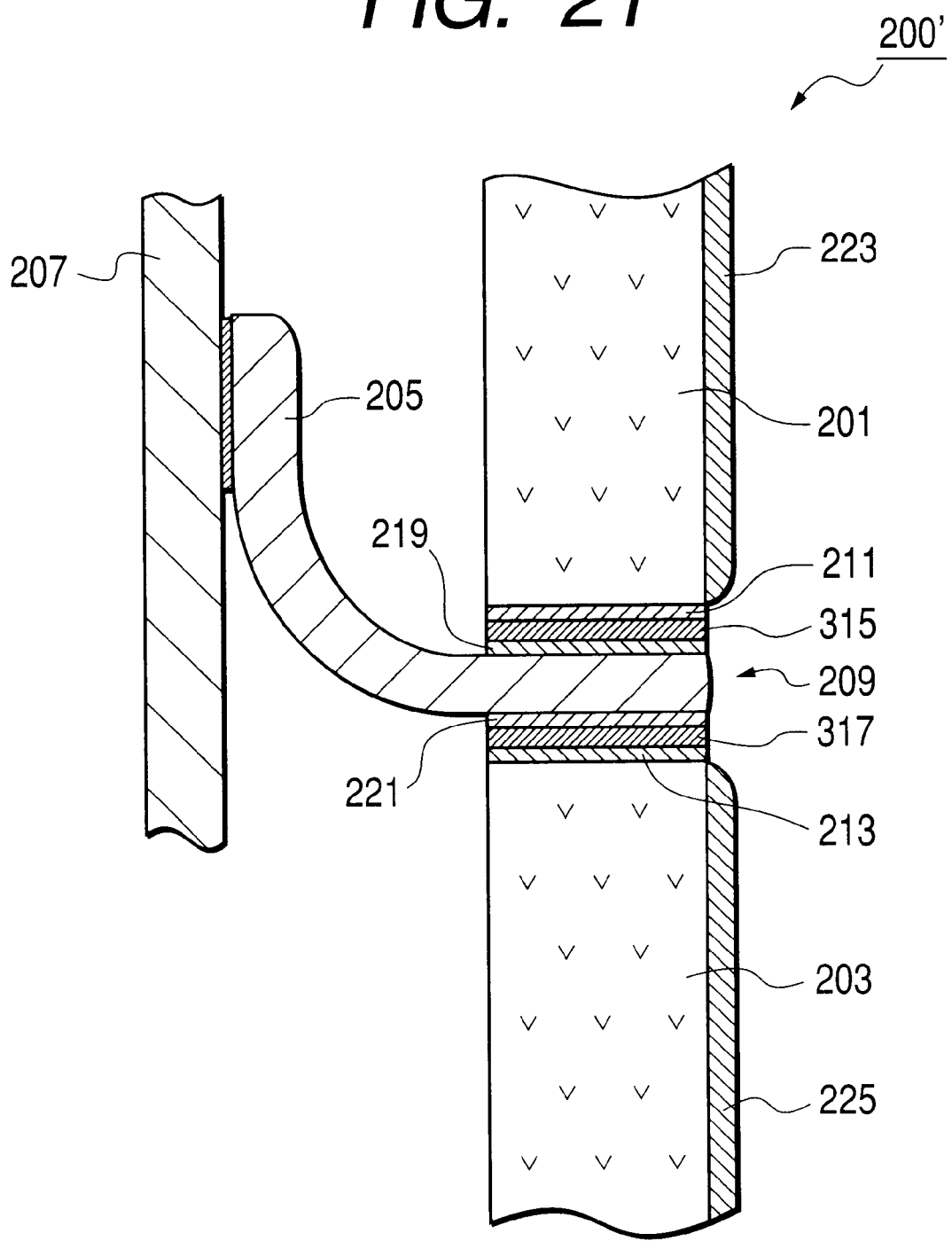
FIG. 21 is a sectional view illustrating an important part of the vacuum switch shown in Comparative Example 8.

The vacuum switch is explained by FIG. 21 in the same manner as the above-described explanations by FIG. 7 in EXAMPLE 4 except that the reference sign 200" is replaced with 200'.

The two insulating valves 201 and 203 have, on the outer circumferential surfaces thereof, glaze layers 223 and 225, respectively, which are the same as the glaze layer in Comparative Example 7.

This Comparative Example brings about the same effects as Comparative Example 7.

What is claimed is:

1. A process for producing a ceramic member for bonding, said ceramic member comprising:
    a ceramic base which is a sintered ceramic;
    a metallic layer formed by metallization, which is a lower layer comprising a nickel ingredient, a tungsten ingredient and a molybdenum ingredient provided on a surface of the ceramic base; and
    an alloy layer, which is an upper layer comprising a nickel ingredient and at least one of a copper ingredient and a manganese ingredient provided on a surface of the metallic layer directly or through an interlayer,
    which method comprises:
    a first step of preparing a lower layer paste with the use of a first mixture comprising a nickel ingredient, a tungsten ingredient and a molybdenum ingredient, applying the lower layer paste to a surface of a ceramic base which is a sintered ceramic, and drying the resultant coating layer to form a lower layer after the applying;
    a second step of preparing an upper layer paste with the use of a second mixture comprising one of a nickel ingredient and a nickel oxide ingredient and at least one of a copper ingredient, a copper oxide ingredient, a manganese ingredient and a manganese oxide ingredient, applying the upper layer paste to the lower layer, and drying the resultant coating layer to form an upper layer after the applying; and
    a third step of heating the lower layer and the upper layer to bake the lower layer and the upper layer.

2. The process for producing a ceramic member for bonding according to claim 1, wherein the first mixture comprises 1 to 10% by weight of the nickel ingredient, 20 to 69% by weight of the tungsten ingredient and 30 to 69% by weight of the molybdenum ingredient.

3. The process for producing a ceramic member for bonding according to claim 1, wherein the first mixture further comprises 2 to 15% by weight of a silicon oxide ingredient.

4. The process for producing a ceramic member for bonding according to claim 1, wherein the second mixture comprises 35 to 75% by weight of the one of a nickel ingredient and a nickel oxide ingredient, and 25 to 65% by weight of the at least one of a copper ingredient, a copper oxide ingredient, a manganese ingredient and a manganese oxide ingredient.

5. A ceramic member for bonding, comprising:
    a ceramic base which is a sintered ceramic;
    a metallic layer formed by metallization, which is a lower layer comprising a nickel ingredient, a tungsten ingredient and a molybdenum ingredient provided on a surface of the ceramic base; and
    an alloy layer, which is an upper layer comprising a nickel ingredient and at least one of a copper ingredient and a manganese ingredient provided on a surface of the metallic layer directly or through an interlayer.

6. The ceramic member for bonding according to claim 5, wherein the metallic layer comprises 0.7 to 8% by weight of the nickel ingredient, 15 to 75% by weight of the tungsten ingredient, and 20 to 80% by weight of the molybdenum ingredient.

7. The ceramic member for bonding according to claim 5, wherein the metallic layer further comprises 3 to 18% by weight of a silicon oxide ingredient as calculated in terms of $Si_2O$.

8. The ceramic member for bonding according to claim 5, wherein the alloy layer comprises 10 to 75% by weight of the nickel ingredient, 20 to 85% by weight of the copper ingredient, and 5 to 40% by weight of the manganese ingredient.

9. The ceramic member for bonding according to claim 5, wherein the interlayer provided interposed between the metallic layer as a lower layer and the alloy layer as an upper layer is an interlayer comprising a nickel-molybdenum alloy.

10. A bonded object comprising the ceramic member for bonding according to claim 5, and a metallic member bonded to the ceramic member through at least the metallic layer of the ceramic member and the alloy layer of the ceramic member.

11. A bonded object comprising
   a ceramic member for bonding, comprising: a ceramic base which is a sintered ceramic; a metallic layer formed by metallization, which is a lower layer comprising a nickel ingredient, a tungsten ingredient and a molybdenum ingredient provided on a surface of the ceramic base; and an alloy layer, which is an upper layer comprising a nickel ingredient and at least one of a copper ingredient and a manganese ingredient provided on a surface of the metallic layer directly or through an interlayer, and
   another ceramic member for bonding, bonded to the ceramic member through at least the metallic layer of the ceramic member and the alloy layer of the ceramic member.

12. A vacuum switch comprising the bonded object according to claim 10.

13. A vacuum switch comprising the bonded object according to claim 11.

14. A vacuum vessel comprising the bonded object according to claim 10.

15. A vacuum vessel comprising the bonded object according to claim 11.

* * * * *